United States Patent
Chandrashekar et al.

(10) Patent No.: US 9,548,228 B2
(45) Date of Patent: Jan. 17, 2017

(54) VOID FREE TUNGSTEN FILL IN DIFFERENT SIZED FEATURES

(71) Applicant: Lam Research Corporation, Fremont, CA (US)

(72) Inventors: Anand Chandrashekar, Fremont, CA (US); Raashina Humayun, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/341,646

(22) Filed: Jul. 25, 2014

(65) Prior Publication Data
US 2015/0024592 A1  Jan. 22, 2015

Related U.S. Application Data

(63) Continuation-in-part of application No. 13/888,077, filed on May 6, 2013, now Pat. No. 8,835,317, which is
(Continued)

(51) Int. Cl.
*H01L 21/285*   (2006.01)
*H01L 21/67*    (2006.01)
(Continued)

(52) U.S. Cl.
CPC ... *H01L 21/67207* (2013.01); *H01L 21/28556* (2013.01); *H01L 21/28568* (2013.01);
(Continued)

(58) Field of Classification Search
CPC ............... H01L 21/28568; H01L 21/67207; H01L 21/486; H01L 21/76865; H01L 21/76877
See application file for complete search history.

(56) References Cited

U.S. PATENT DOCUMENTS 4,713,141 A   12/1987   Tsang
4,714,520 A   12/1987   Gwozdz
(Continued)

FOREIGN PATENT DOCUMENTS

CN   101899649 A   12/2010
CN   103125013 A   5/2013
(Continued)

OTHER PUBLICATIONS

U.S. Appl. No. 14/502,817, filed Sep. 30, 2014, entitled "Tungsten Feature Fill."
(Continued)

*Primary Examiner* — Thanhha Pham
(74) *Attorney, Agent, or Firm* — Weaver Austin Villeneuve & Sampson LLP

(57) ABSTRACT

Methods of depositing tungsten in different sized features on a substrate are provided herein. The methods involve depositing a first bulk layer of tungsten in the features, etching the deposited tungsten, depositing a second bulk tungsten, which is interrupted to treat the tungsten after the smaller features are completely filled, and resuming deposition of the second bulk layer after treatment to deposit smaller, smoother tungsten grains into the large features. The methods also involve depositing tungsten in multiple cycles of dep-etch-dep, where each cycle targets a group of similarly sized features using etch chemistry specific for that group, and depositing in groups from smallest sized features to the largest sized features. Deposition using methods described herein produce smaller, smoother grains with void-free fill for a wide range of sized features in a substrate.

12 Claims, 11 Drawing Sheets

Related U.S. Application Data a continuation of application No. 13/351,970, filed on Jan. 17, 2012, now Pat. No. 8,435,894, which is a continuation of application No. 13/016,656, filed on Jan. 28, 2011, now Pat. No. 8,124,531, which is a continuation-in-part of application No. 12/535,464, filed on Aug. 4, 2009, now Pat. No. 8,119,527, and a continuation-in-part of application No. 12/833,823, filed on Jul. 9, 2010.

(60) Provisional application No. 61/858,114, filed on Jul. 25, 2013.

(51) Int. Cl.
*H01L 21/768* (2006.01)
*H01L 21/3213* (2006.01)

(52) U.S. Cl.
CPC .. *H01L 21/76865* (2013.01); *H01L 21/76877* (2013.01); *H01L 21/32136* (2013.01)

(56) References Cited

U.S. PATENT DOCUMENTS

| | | | |
|---|---|---|---|
| 4,804,560 A | 2/1989 | Shioya et al. |
| 4,874,723 A | 10/1989 | Jucha et al. |
| 4,891,550 A | 1/1990 | Northrop et al. |
| 4,988,644 A | 1/1991 | Jucha et al. |
| 4,997,520 A | 3/1991 | Jucha et al. |
| 5,037,775 A | 8/1991 | Reisman |
| 5,147,500 A | 9/1992 | Tachi et al. |
| 5,164,330 A | 11/1992 | Davis et al. |
| 5,489,552 A | 2/1996 | Merchant et al. |
| 5,719,410 A | 2/1998 | Suehiro et al. |
| 5,747,379 A | 5/1998 | Huang et al. |
| 5,767,015 A | 6/1998 | Tabara |
| 5,807,786 A | 9/1998 | Chang |
| 5,833,817 A | 11/1998 | Tsai et al. |
| 5,861,671 A | 1/1999 | Tsai et al. |
| 5,866,483 A | 2/1999 | Shiau et al. |
| 5,893,758 A | 4/1999 | Sandhu et al. |
| 5,914,277 A | 6/1999 | Shinohara |
| 5,990,020 A | 11/1999 | Ha |
| 6,011,311 A | 1/2000 | Hsing et al. |
| 6,030,881 A | 2/2000 | Papasouliotis et al. |
| 6,100,193 A | 8/2000 | Suehiro et al. |
| 6,110,822 A | 8/2000 | Huang et al. |
| 6,184,158 B1 | 2/2001 | Shufflebotham et al. |
| 6,221,754 B1 | 4/2001 | Chiou et al. |
| 6,245,654 B1 | 6/2001 | Shih et al. |
| 6,376,376 B1 | 4/2002 | Lim et al. |
| 6,383,910 B2 | 5/2002 | Okada et al. |
| 6,432,830 B1 | 8/2002 | Merry |
| 6,436,809 B1 | 8/2002 | Kwag et al. |
| 6,593,233 B1 | 7/2003 | Miyazaki et al. |
| 6,607,985 B1 | 8/2003 | Kraft et al. |
| 6,635,965 B1 | 10/2003 | Lee et al. |
| 6,683,000 B2 | 1/2004 | Fukui et al. |
| 6,696,337 B2 | 2/2004 | Asano et al. |
| 6,828,226 B1 | 12/2004 | Chen et al. |
| 6,844,258 B1 | 1/2005 | Fair et al. |
| 6,872,323 B1 | 3/2005 | Entley et al. |
| 7,005,372 B2 | 2/2006 | Levy et al. |
| 7,026,246 B2 | 4/2006 | Yun |
| 7,115,516 B2 | 10/2006 | Chen et al. |
| 7,141,494 B2 | 11/2006 | Lee et al. |
| 7,193,369 B2 | 3/2007 | Min et al. |
| 7,427,568 B2 | 9/2008 | Chen et al. |
| 7,504,725 B2 | 3/2009 | Kim et al. |
| 7,578,944 B2 | 8/2009 | Min et al. |
| 7,589,017 B2 | 9/2009 | Chan et al. |
| 7,655,567 B1 | 2/2010 | Gao et al. |
| 7,772,114 B2 | 8/2010 | Chan et al. |
| 7,772,121 B2 | 8/2010 | Chen et al. |
| 7,955,972 B2 | 6/2011 | Chan et al. |
| 7,993,460 B2 | 8/2011 | Steger |
| 8,058,170 B2 | 11/2011 | Chandrashekar et al. |
| 8,071,478 B2 | 12/2011 | Wu et al. |
| 8,119,527 B1 | 2/2012 | Chandrashekar et al. |
| 8,124,531 B2 | 2/2012 | Chandrashekar et al. |
| 8,129,270 B1 | 3/2012 | Chandrashekar et al. |
| 8,153,520 B1 | 4/2012 | Chandrashekar et al. |
| 8,262,800 B1 | 9/2012 | Wongsenakhum et al. |
| 8,399,351 B2 | 3/2013 | Takahashi |
| 8,435,894 B2 | 5/2013 | Chandrashekar et al. |
| 8,501,620 B2 | 8/2013 | Chandrashekar et al. |
| 8,551,885 B2 | 10/2013 | Chen et al. |
| 8,835,317 B2 | 9/2014 | Chandrashekar et al. |
| 8,883,637 B2 | 11/2014 | Jeng et al. |
| 9,034,768 B2 | 5/2015 | Chandrashekar et al. |
| 9,082,826 B2 | 7/2015 | Chandrashekar et al. |
| 9,240,347 B2 | 1/2016 | Chandrashekar et al. |
| 2002/0090811 A1 | 7/2002 | Kim et al. |
| 2002/0132472 A1 | 9/2002 | Park |
| 2002/0177325 A1 | 11/2002 | Takewaka et al. |
| 2003/0017701 A1 | 1/2003 | Nakahara et al. |
| 2003/0082902 A1 | 5/2003 | Fukui et al. |
| 2003/0109145 A1 | 6/2003 | Yun |
| 2003/0190802 A1 | 10/2003 | Wang et al. |
| 2003/0194850 A1 | 10/2003 | Lewis et al. |
| 2003/0235995 A1 | 12/2003 | Oluseyi et al. |
| 2004/0025091 A1 | 2/2004 | Totman et al. |
| 2004/0077161 A1 | 4/2004 | Chen et al. |
| 2004/0079632 A1 | 4/2004 | Ahmad et al. |
| 2004/0245091 A1 | 12/2004 | Karim et al. |
| 2004/0266174 A1 | 12/2004 | Yang et al. |
| 2005/0006222 A1 | 1/2005 | Ding et al. |
| 2005/0031786 A1 | 2/2005 | Lee et al. |
| 2005/0042829 A1 | 2/2005 | Kim et al. |
| 2005/0179141 A1 | 8/2005 | Yun et al. |
| 2005/0250316 A1 | 11/2005 | Choi et al. |
| 2005/0275941 A1 | 12/2005 | Liu et al. |
| 2006/0075966 A1 | 4/2006 | Chen et al. |
| 2006/0084269 A1 | 4/2006 | Min et al. |
| 2006/0094238 A1 | 5/2006 | Levy et al. |
| 2006/0214244 A1 | 9/2006 | Minakata |
| 2007/0006893 A1 | 1/2007 | Ji |
| 2007/0187362 A1 | 8/2007 | Nakagawa et al. |
| 2008/0054472 A1 | 3/2008 | Shinriki et al. |
| 2008/0254623 A1 | 10/2008 | Chan et al. |
| 2008/0318417 A1 | 12/2008 | Shinriki et al. |
| 2009/0053893 A1 | 2/2009 | Khandelwal et al. |
| 2009/0163025 A1 | 6/2009 | Humayun et al. |
| 2010/0072623 A1 | 3/2010 | Prindle et al. |
| 2010/0130002 A1 | 5/2010 | Dao et al. |
| 2010/0144140 A1 | 6/2010 | Chandrashekar et al. |
| 2010/0240212 A1 | 9/2010 | Takahashi |
| 2010/0267230 A1 | 10/2010 | Chandrashekar et al. |
| 2011/0151670 A1 | 6/2011 | Lee et al. |
| 2011/0159690 A1 | 6/2011 | Chandrashekar et al. |
| 2011/0212274 A1 | 9/2011 | Selsley |
| 2011/0233778 A1 | 9/2011 | Lee et al. |
| 2012/0009785 A1 | 1/2012 | Chandrashekar et al. |
| 2012/0115329 A1 | 5/2012 | Chandrashekar et al. |
| 2012/0164832 A1 | 6/2012 | Chandrashekar et al. |
| 2013/0062677 A1 | 3/2013 | Li et al. |
| 2013/0105303 A1 | 5/2013 | Lubomirsky et al. |
| 2013/0168354 A1 | 7/2013 | Kanarik |
| 2013/0171822 A1 | 7/2013 | Chandrashekar et al. |
| 2013/0302980 A1 | 11/2013 | Chandrashekar et al. |
| 2013/0330926 A1 | 12/2013 | Chandrashekar et al. |
| 2014/0017891 A1 | 1/2014 | Chandrashekar et al. |
| 2014/0231896 A1 | 8/2014 | Matsumori et al. |
| 2014/0273451 A1 | 9/2014 | Wang et al. |
| 2014/0349477 A1 | 11/2014 | Chandrashekar et al. |
| 2015/0056803 A1 | 2/2015 | Chandrashekar et al. |
| 2015/0111374 A1* | 4/2015 | Bao ................ H01L 21/30655 438/586 |

(56) References Cited

U.S. PATENT DOCUMENTS

2016/0020152 A1  1/2016  Posseme
2016/0190008 A1  6/2016  Chandrashekar et al.

FOREIGN PATENT DOCUMENTS

| | | |
|---|---|---|
| EP | 1 055 746 | 11/2000 |
| JP | H04-56130 | 2/1992 |
| JP | H07-094488 | 4/1995 |
| JP | H07-226393 | 8/1995 |
| JP | H09-326436 | 12/1997 |
| JP | 10-178014 A | 6/1998 |
| JP | 2001-007048 | 1/2001 |
| JP | 2001-274114 | 10/2001 |
| JP | 2002-009017 | 1/2002 |
| JP | 2002-305162 | 10/2002 |
| JP | 2003-007677 | 1/2003 |
| JP | 2003-142484 | 5/2003 |
| JP | 2006-278496 | 10/2006 |
| JP | 2007-251164 | 9/2007 |
| JP | 2008-000742 | 1/2008 |
| JP | 2008-057042 | 3/2008 |
| JP | 2010-225697 | 10/2010 |
| KR | 10-2003-0035877 | 5/2003 |
| KR | 10-2003-0058853 | 7/2003 |
| KR | 10-2004-0087406 | 10/2004 |
| KR | 10-2005-0011479 | 1/2005 |
| KR | 10-2005-0013187 | 2/2005 |
| KR | 10-2006-0087844 | 8/2006 |
| KR | 10-2010-0067065 | 6/2010 |
| KR | 1201074 | 11/2012 |
| TW | 557503 | 10/2003 |
| WO | WO 99/67056 | 12/1999 |
| WO | WO 2013/148444 | 10/2013 |
| WO | WO 2013/148880 | 10/2013 |

OTHER PUBLICATIONS

US Office Action dated Dec. 30, 2009 issued in U.S. Appl. No. 12/332,017.
US Final Office Action dated Jul. 26, 2010 issued in U.S. Appl. No. 12/332,017.
US Office Action dated Nov. 15, 2010 issued in U.S. Appl. No. 12/332,017.
US Final Office Action dated Jul. 22, 2011 issued in U.S. Appl. No. 12/332,017.
US Notice of Allowance dated Oct. 28, 2011 issued in U.S. Appl. No. 12/332,017.
US Office Action dated Nov. 1, 2010 issued in U.S. Appl. No. 12/535,377.
US Office Action dated Jun. 14, 2011 issued in U.S. Appl. No. 12/535,377.
US Final Office Action dated Dec. 1, 2011 issued in U.S. Appl. No. 12/535,377.
US Office Action dated Mar. 7, 2013 issued in U.S. Appl. No. 12/535,377.
US Final Office Action dated Oct. 7, 2013 issued in U.S. Appl. No. 12/535,377.
US Office Action dated Nov. 23, 2012 issued in U.S. Appl. No. 13/412,534.
US Notice of Allowance dated Apr. 8, 2013, issued in U.S. Appl. No. 13/412,534.
US Office Action dated Apr. 11, 2014 issued in U.S. Appl. No. 13/934,089.
US Office Action dated Sep. 13, 2010 issued in U.S. Appl. No. 12/535,464.
US Final Office Action dated Apr. 14, 2011 issued in U.S. Appl. No. 12/535,464.
US Office Action dated Jul. 28, 2011 issued in U.S. Appl. No. 12/535,464.
US Office Action dated Oct. 12, 2011 issued in U.S. Appl. No. 12/535,464.
US Notice of Allowance dated Dec. 30, 2011 issued in U.S. Appl. No. 12/535,464.
US Office Action dated Sep. 2, 2011 issued in U.S. Appl. No. 12/534,566.
US Notice of Allowance dated Dec. 20, 2011 issued in U.S. Appl. No. 12/534,566.
US Office Action dated Mar. 13, 2012 issued in U.S. Appl. No. 12/833,823.
US Final Office Action dated Dec. 21, 2012 issued in U.S. Appl. No. 12/833,823.
US Office Action dated Sep. 9, 2013 issued in U.S. Appl. No. 12/833,823.
US Final Office Action dated Apr. 1, 2014 issued in U.S. Appl. No. 12/833,823.
US Office Action dated Nov. 25, 2011 issued in U.S. Appl. No. 13/016,656.
US Notice of Allowance dated Jan. 9, 2012 issued in U.S. Appl. No. 13/016,656.
US Office Action dated Mar. 27, 2012 issued in U.S. Appl. No. 13/351,970.
US Final Office Action dated Sep. 11, 2012 issued in U.S. Appl. No. 13/351,970.
US Notice of Allowance dated Jan. 9, 2013 issued in U.S. Appl. No. 13/351,970.
US Office Action dated Jan. 6, 2014 issued in U.S. Appl. No. 13/888,077.
US Notice of Allowance, dated May 12, 2014 issued in U.S. Appl. No. 13/888,077.
JP Office Action dated Mar. 11, 2014 issued in Japanese Appl. No. 2009-278990.
KR Office Action dated Aug. 8, 2011 issued in Korean Appl. No. 10-2009-0122292.
KR Office Action dated Jun. 26, 2012 issued in Korean Appl. No. 10-2009-0122292.
KR Office Action dated Nov. 6, 2012, issued in Korean Appl. No. 2012-0104518.
TW Office Action dated Mar. 27, 2014, issued in Taiwan Appl. No. 098142115.
JP Office Action dated Feb. 25, 2014 issued in Japanese Appl. No. 2009-292610.
KR Office Action dated Sep. 12, 2012 issued in Korean Appl. No. 2012-0104518.
TW Office Action dated Apr. 29, 2014, issued in Taiwan Appl. No. 098146010.
SG Examination and Search Report dated Dec. 14, 2011 issued in Singapore Appl. No. 201005237-1.
KR Provisional Rejection dated Nov. 16, 2012, issued in Korean Appl. No. 2011-0068603.
PCT International Search Report and Written Opinion, dated Jun. 28, 2013, issued in PCT/US2013/033174.
PCT International Preliminary Report on Patentaiblity and Written Opinion, dated Oct. 9, 2014, issued in PCT/US2013/033174.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Tsang, C.K. et al., "CMOS-Compatible Through Silicon Vias for 3D Process Integration", Materials Research Society 2007 Symposium Proceedings vol. 970, paper 0970-Y01-01.
Dimensions of Wafer as described by Wikepedia, 2008, 1 page.
Deposition Process, Oxford Electronics, 1996, 1 page.
US Notice of Allowance dated Mar. 18, 2015 issued in U.S. Appl. No. 14/285,505.
US Notice of Allowance dated May 14, 2015 issued in U.S. Appl. No. 14/285,505.
US Examiner's Answer to Appeal Brief dated Apr. 17, 2015 issued in U.S. Appl. No. 12/535,377.
US Office Action dated Nov. 12, 2014 issued in U.S. Appl. No. 13/934,089.
US Notice of Allowance dated Jan. 14, 2015 issued in U.S. Appl. No. 12/833,823.
US Office Action, dated Jan. 15, 2015, issued in U.S. Appl. No. 13/774,350.

(56) References Cited

OTHER PUBLICATIONS

US Office Action, dated Dec. 23, 2014, issued in U.S. Appl. No. 13/851,885.
US Office Action dated Dec. 18, 2014 issued in U.S. Appl. No. 14/502,817.
JP Final Office Action dated Mar. 17, 2015 issued in Japanese Application No. 2009-278990.
TW Office Action (Decision) dated Oct. 13, 2014, issued in Taiwan Application No. 098142115.
JP Office Action dated Feb. 10, 2015 issued in Japanese Application No. 2009-292610.
Chen et al., (Aug. 2003) "Advances in Remote Plasma Sources For Cleaning 300 mm and Flat Panel CVD Systems," *Semiconductor Magazine*, 6 pp.
Rosner et al., (1971) "Kinetics of the attack of refractory solids by atomic and molecular fluorine," *The Journal of Physical Chemistry*, 75(3):308-317.
U.S. Patent Application entitled, "Atomic Layer Etching of Tungsten for Enhanced Tungsten Deposition Fill," U.S. Appl. No. 14/830,683, filed Aug. 29, 2015.
US Office Action dated Oct. 9, 2015 issued in U.S. Appl. No. 12/535,377.
US Office Action dated Jul. 8, 2015 issued in U.S. Appl. No. 13/934,089.
US Office Action, dated Oct. 8, 2015, issued in U.S. Appl. No. 13/774,350.
US Final Office Action dated Jul. 17, 2015 issued in U.S. Appl. No. 14/502,817.
US Notice of Allowance dated Sep. 25, 2015 issued in U.S. Appl. No. 14/502,817.
SG Written Examination Report and Search Report dated Jun. 30, 2015 issued in Singapore Application No. 201303450-9.
US Office Action dated Jul. 1, 2016 issued in U.S. Appl. No. 14/830,683.
US Final Office Action dated May 5, 2016 issued in U.S. Appl. No. 12/535,377.
US Final Office Action dated Dec. 31, 2015 issued in U.S. Appl. No. 13/934,089.
US Office Action dated Jun. 1, 2016 issued in U.S. Appl. No. 13/934,089.
US Office Action, dated Jun. 2, 2016, issued in U.S. Appl. No. 13/774,350.
Singapore Search and Examination Report dated Jan. 26, 2016 issued in Application No. SG 201303450-9.
Chinese First Office Action dated Feb. 26, 2016, issued in Application No. CN 201380022648.2.
Chinese First Office Action dated Mar. 18, 2016 issued in Application No. CN 201380022693.8.
Carver et al. (Feb. 20, 2015) "Atomic Layer Etching: An Industry Perspective," *ECS Journal of Solid State Science and Technology*,4(6):N5005-N5009.

\* cited by examiner

VOID FREE TUNGSTEN FILL IN DIFFERENT SIZED FEATURES

CROSS-REFERENCE TO RELATED APPLICATION

This application claims benefit of U.S. Provisional Patent Application No. 61/858,114, filed Jul. 25, 2013, and titled "TUNGSTEN FEATURE FILL OF MULTIPLE FEATURE SIZES," which is incorporated by reference herein in its entirety and for all purposes. This application is also a continuation-in-part of U.S. patent application Ser. No. 13/888,077, entitled "DEPOSITING TUNGSTEN INTO HIGH ASPECT RATIO FEATURES," filed May 6, 2013, which is a continuation of U.S. patent application Ser. No. 13/351,970 (now U.S. Pat. No. 8,435,894), entitled "DEPOSITING TUNGSTEN INTO HIGH ASPECT RATIO FEATURES," filed Jan. 17, 2012, which is a continuation of U.S. patent application Ser. No. 13/016,656 (now U.S. Pat. No. 8,124,531), entitled "DEPOSITING TUNGSTEN INTO HIGH ASPECT RATIO FEATURES," filed on Jan. 28, 2011, which is a continuation-in-part of U.S. patent application Ser. No. 12/535,464 (now U.S. Pat. No. 8,119,527), entitled "DEPOSITING TUNGSTEN INTO HIGH ASPECT RATIO FEATURES," filed on Aug. 4, 2009, and is a continuation-in-part of U.S. patent application Ser. No. 12/833,823 entitled "DEPOSITING TUNGSTEN INTO HIGH ASPECT RATIO FEATURES," filed on Jul. 9, 2010, all of which are incorporated herein by this reference for all purposes.

BACKGROUND

Deposition of tungsten-containing materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional deposition process, a substrate is heated to a predetermined process temperature in a deposition chamber, and a thin layer of tungsten-containing material that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and high aspect ratio features may cause formation of seams and voids inside the filled features. Large seams may lead to high resistance, contamination, loss of filled materials, and otherwise degrade performance of integrated circuits. For example, a seam may extend close to the field region after filling process and then open during chemical-mechanical planarization.

SUMMARY

Provided herein are methods of depositing tungsten into features of different sizes. On aspect involves a method of processing semiconductor substrates by: (i) providing a substrate comprising features having different size openings; (ii) depositing a first bulk tungsten layer in the features to partially fill the features; (iii) performing a nonconformal etch of the first bulk tungsten layer to leave an etched tungsten layer in the features, including removing more tungsten from the top of the features than in the interior of the features; and (iv) depositing a second bulk tungsten layer on the etched tungsten layer, such that the second bulk tungsten layer deposition is interrupted to treat the etched tungsten layer when smaller features are filled.

In some embodiments, treating the substrate includes exposing the substrate to a reducing agent. The reducing agent may be selected from the group consisting of boranes, silanes, and hydrogen. In some embodiments, treating the substrate includes exposing the substrate to nitrogen, annealing the substrate, and/or depositing a barrier layer on the substrate. The barrier layer may be, for example, tungsten nitride.

In various embodiments, the features have openings between about 1 nm and about 1 micron. In some embodiments, the features have about twenty different size openings.

Another aspect involves a method of processing semiconductor substrates by: (i) providing a substrate comprising features having at least one group of smaller features and at least one group of larger features; (ii) depositing tungsten a first bulk tungsten layer in the features; (iii) etching a portion of the first bulk tungsten layer at a first temperature; (iv) depositing a second bulk tungsten layer on the etched first tungsten layer to fill one of the at least one group of smaller features and at least partially fill the other features; (v) etching a portion of the second bulk tungsten layer at a second temperature; and (vi) depositing a third bulk tungsten layer on the etched second tungsten layer to fill one of the at least one group of larger features.

In some embodiments, the first temperature is lower than the second temperature. In some embodiments, the first temperature is greater than the second temperature.

In various embodiments, each of the at least one group of smaller features and the at least one group of larger features includes features having at least one feature size. Each of the at least one group of smaller features may include one feature and each of the at least one group of larger features may include one feature. In some embodiments, the at least one group of smaller features includes features having an opening between about 1 nm and about 2 nm.

In various embodiments, the features in the at least one group of larger features have an opening between about 100 nm to about 1 micron. In some embodiments, the largest feature in the group having the largest features has a critical dimension at least five times larger than the critical dimension of the largest feature in the group having the smallest features.

Another aspect involves an apparatus for processing semiconductor substrates which includes a process chamber including a showerhead and a substrate support, and a controller having at least one processor and a memory, such that the at least one processor and the memory are communicatively connected with one another, the at least one processor is at least operatively connected with the flow-control hardware, and the memory stores machine-readable instructions for: introducing a tungsten-containing precursor and a reducing agent to the chamber; introducing a fluorine-containing etchant to the chamber to etch a portion of the first bulk tungsten layer to leave an etched tungsten layer in the features; introducing a tungsten-containing precursor and reducing agent to the chamber to deposit a second bulk tungsten layer; temporarily terminating deposition of the second bulk tungsten layer at a predetermined time; introducing a treatment reagent to the chamber; terminating the introduction of the treatment reagent to the chamber; and resuming introducing a tungsten-containing precursor and reducing agent to the chamber to deposit a second bulk tungsten layer.

In some embodiments, the treatment reagent is selected from the group consisting of boranes, silanes, and hydrogen. In some embodiments, the predetermined time is the time when the small features are filled.

These and other aspects are described further below with reference to the drawings.

DETAILED DESCRIPTION

Figure 1:
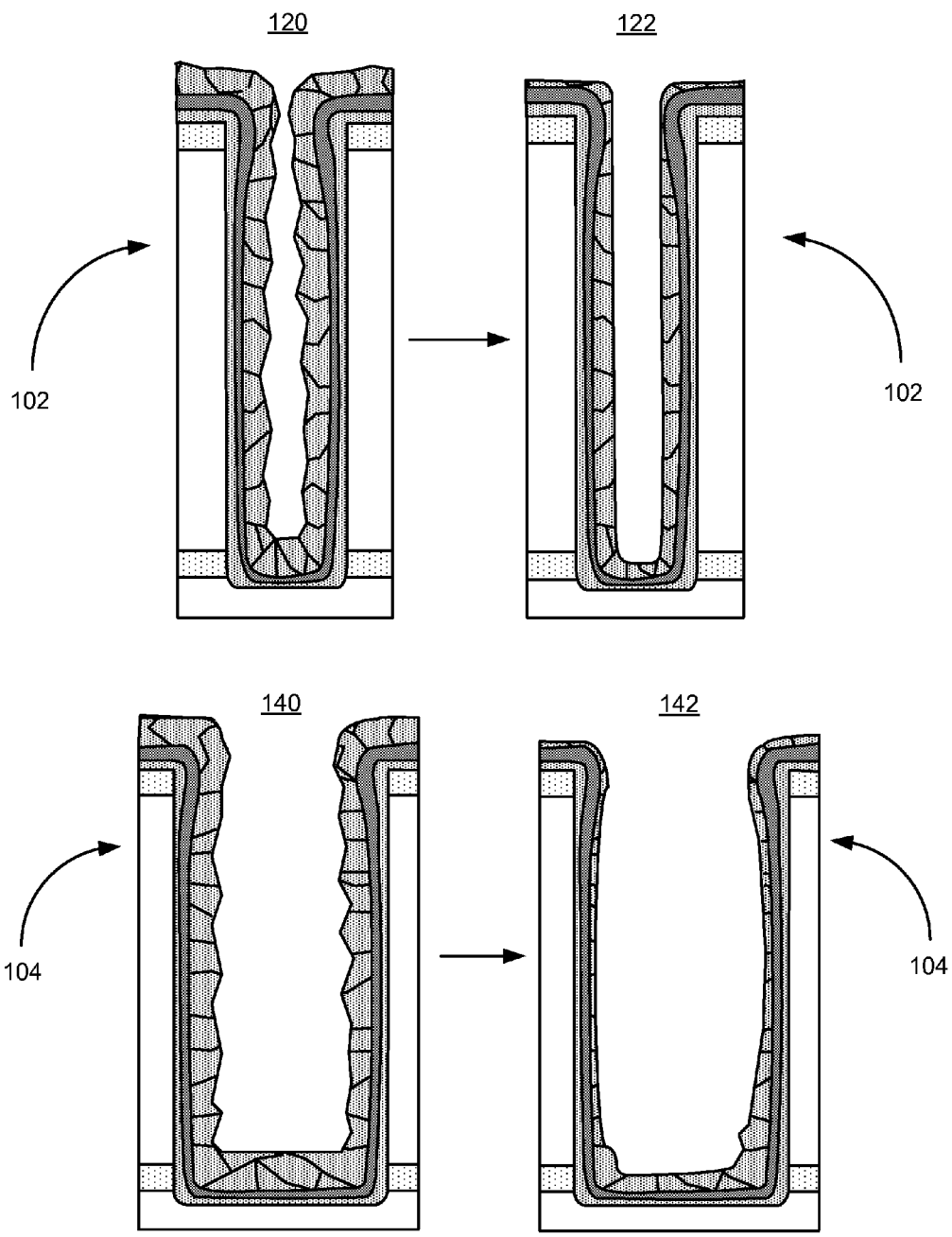
FIG. 1 is a schematic representation of small and large features at various stages of deposition and etching.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Described herein are methods of filling features with tungsten and, related systems and apparatuses. Examples of applications include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as vertical NAND (VNAND) wordlines. The methods can also be used in fabrication of FinFET structures. Features formed in a substrate can be characterized by one or more of narrow and/or re-entrant openings, constrictions within the feature, and high aspect ratios. The substrate may be a silicon wafer, e.g., a 200-mm wafer, a 300-mm wafer, or a 450-mm wafer, including wafers having one or more layers of material such as dielectric, conducting, or semi-conducting material deposited thereon.

A feature may be formed in one or more of these layers. For example, a feature may be formed at least partially in a dielectric layer. A single substrate as described herein has features of different sizes, with up to and, in some embodiments, over 20 different sizes on a single wafer. A feature hole may also have a dimension near the opening, e.g., an opening diameter or line width, of between about 1 nm to 1 micron, for example between about 25 nm to 300 nm. A "small" feature may be defined as a feature having an opening diameter or line width less than that of a "large" feature in relative terms. Large features may have an opening diameter or a critical dimension at least 1.5 times, or at least 2 times, or at least 5 times, or at least 10 times or more than 10 times larger than the critical dimension of small features. Examples of "small" features include features having an opening diameter between about 1 nm and about 2 nm. Examples of "large" features include features having an opening diameter on the order of hundreds of nanometers to about 1 micron. A feature hole can be referred to as an unfilled feature or simply a feature. In some implementations, a feature hole may have an aspect ratio of at least about 2:1, at least about 4:1, at least about 6:1 or higher.

In filling features of a single size on a substrate, deposition of a tungsten layer in the feature to partially fill the feature, followed by removal of a portion of the deposited tungsten such that the reduction in the average thickness of the deposited layer near the opening is greater than the reduction in the average thickness of the deposited layer inside the feature, may be used to produce void-free feature fill. However, when a wide range of feature sizes are to be filled, this approach may not provide maximum fill improvement benefit.

This is illustrated in FIG. 1, which shows a small critical dimension (CD) feature 102 and a large CD feature 104 on a substrate. Such features may be filled by depositing a first bulk layer of tungsten in the feature, etching the first bulk layer, then depositing a second bulk layer to fill the rest of the feature. This scheme may be described herein as "dep-etch-dep." The first bulk deposition (e.g., the first "dep" or "dept" of "dep-etch-dep") partially fills the small CD feature 102 to yield the partially filled small CD feature in 120. Because the feature has a re-entrant profile, i.e., a profile that narrows toward the feature opening, there is a pinch-off point at which deposition may pinch-off the feature opening. This first bulk deposition partially fills the large CD feature 104 to also yield a partially filled large CD feature as shown in 140. A tungsten etch (e.g., the "etch" of "dep-etch-dep") may preferentially remove tungsten near the feature opening of the small CD feature 104, as shown in 122, with little to no tungsten etched on the sidewalls of the features due to the small opening of the feature. This reshapes the feature profile, allowing void free fill in a subsequent deposition (e.g., the second "dep" or "dep2" of "dep-etch-dep") (not shown) with no pinching off. However, with the large CD feature 104, the tungsten is etched similarly at the top and deep inside the feature, without the benefit of re-shaping the feature profile, as shown in 142, due to the larger opening at the top of the feature 104.

The variations in tungsten fill across a wafer that result from differences in feature size and feature density are referred to as pattern loading effects. Filling features in this manner results in uneven and rough tungsten growth on a substrate having multiple feature sizes. Large features are mainly filled using the second bulk deposition of tungsten, resulting in large, rough grains of tungsten in the large features due to a pattern loading effect.

Provided herein are methods of filling features of different sizes on a substrate with smoother tungsten and reduce pattern loading effects. The methods may be used for feature fill of features of any orientation, including vertical and horizontal orientations. In some implementations, the methods may be used to fill features having an angled orientation with respect to the plane of the substrate. In some implementations, the methods may be used to fill a feature having multiple orientations. Examples of such features include 3-D features in which deposition gases may enter a feature vertically and laterally. The methods described herein are particularly applicable to FinFET fabrication, which involves the deposition of tungsten onto a substrate with features having different sizes.

Some implementations of the methods involve interrupting a second bulk deposition to treat the surface of the deposited tungsten, then resuming the second bulk deposition to allow smaller grains to regrow on the treated surface and fill the remainder of the feature with smoother deposited tungsten. Some implementations of the methods involve grouping feature sizes into smaller and larger feature size groups, and performing the first deposition, etch, and second deposition sequence in cycles, while targeting each cycle on a group of feature sizes, from smallest to largest, and choosing each etch chemistry to etch the targeted group of feature sizes.

While the description below focuses on tungsten feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC), and titanium alumide (TiAl)), tantalum-containing materials (e.g., tantalum (Ta), and tantalum nitride (TaN)), and nickel-containing materials (e.g., nickel (Ni) and nickel silicide (NiSi).

Figure 2:
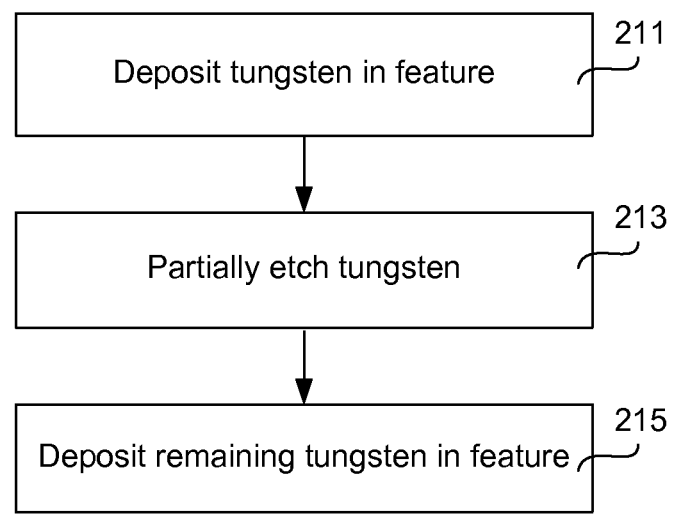
FIG. 2 is a process flow diagram of a method of depositing tungsten in features.

FIG. 2 is a process flow diagram illustrating certain operations of a method of feature fill by depositing a first bulk tungsten, etching the first bulk tungsten, and depositing a second bulk tungsten. The method may begin with depositing tungsten in a feature to partially fill the feature in operation 211. In some embodiments, the tungsten is deposited conformally. In some implementations, operation 211 can involve deposition of a tungsten nucleation layer, followed by bulk deposition. Tungsten nucleation layer deposition and bulk deposition techniques are described further below. In some embodiments, the tungsten nucleation layer is deposited by sequentially pulsing a tungsten-containing precursor and one or more reducing agents to form a tungsten nucleation layer by an atomic layer deposition (ALD) or pulsed nucleation layer (PNL) process. In some implementations, operation 211 may involve only bulk deposition, if, for example, the feature includes an under-layer that supports tungsten deposition. Bulk deposition may be deposited by chemical vapor deposition and is described further below.

In features that include constrictions or are otherwise susceptible to pinch-off, operation 211 can be performed at least until the feature is pinched off. Features having different sizes may pinch off at different times. In conformal deposition, deposition starts from each surface and progresses with growth generally orthogonal to the surface. Tungsten growth in features starts from each sidewall and progresses until the growth pinches off the feature. In some implementations, the amount of tungsten deposited operation 211 can be determined based on the narrowest feature dimension. For example, if the narrowest dimension is 50 nm, a CVD reaction in operation 211 can be allowed to run long enough to deposit 25 nm on each surface, at which point the deposited tungsten blocks further reactant diffusion into the feature. This can generally be determined prior to the reaction based on the reaction kinetics, tungsten nucleation layer thickness, etc. In some implementations, operation 211 can involve multiple dep-etch-dep cycles for a single feature, as described in U.S. Pat. No. 8,124,531, which is incorporated by reference herein. In some implementations, operation 211 does not include any etch operations, with just a deposition until at least the feature is pinched off. Operation 211 can occur in a single chamber, a single station of a multi-station or single station chamber, in multiple stations of multi-station apparatus, or in multiple chambers. For example, operation 211 can involve tungsten nucleation layer deposition in one station of a chamber, followed by bulk deposition in another station of the chamber. During operation 211, many small features may be almost filled, while large features may only have a thinner layer of tungsten deposited.

The process can continue with a partial etch of tungsten in operation 213. Some tungsten remains in the feature, but the etch removes tungsten from at least some of the sidewalls of the feature. Etch in smaller features may only etch the top of the feature near the surface of the substrate, whereas etch in larger features may result in the etchant species delving into the feature and etching even the sidewalls of the feature. Operation 213 generally involves a chemical etch, with, for example, fluorine-containing species or other etchant species. In some implementations, activated species may be used. Activated species can include atomic species, radical species, and ionic species. For the purposes of this application, activated species are distinguished from recombined species and from the gases initially fed into a plasma generator. For example, partially etching the deposited tungsten can involve exposure to etchant species generated in a remote or in-situ plasma generator. In some implementations, both remotely-generated and in-situ generated plasma species may be used, either sequentially or concurrently. In some implementations, a non-plasma chemical etch using $F_2$, $CF_3Cl$, or other etchant chemistry may be used. Operation 213 may occur in the same chamber as operation 210 or in a different chamber. Methods of etching tungsten in a feature are described further below. Depending on the feature architecture, the etch may be conformal or non-conformal. Etch conformality is described further below. The etch back may progress generally laterally (orthogonal to the feature axis) and/or vertically (along the feature axis).

According to various implementations, the etch may be preferential or non-preferential to an under-layer. For example, an etch can be preferential to W with, for example, a Ti or TiN under-layer acting as an etch stop. In some implementations, the etch can etch W and Ti or TiN with an underlying dielectric acting as an etch stop.

In this regime, the removal rate inside the feature is limited by amounts of and/or relative compositions of different etching material components (e.g., an initial etchant material, activated etchant species, and recombined etchant species) that diffuse into the feature. In certain examples, etching rates depend on various etchant components' concentrations at different locations inside the feature. It should be noted that the terms "etching" and "removal" are used interchangeably in this document. It should be understood that selective removal could be performed using any removal techniques, which includes etching as well as other techniques.

The process then continues at operation 215 with deposition on the remaining tungsten such that a second bulk tungsten is deposited in the feature. A subsequent tungsten deposition allows tungsten regrowth inside the via on the existing tungsten layer, while a significant growth delay in the field prevents pinch-off and voids in the final via fill. As discussed above, the significant growth delay may be due, at least in part, to the removal of a surface that supports tungsten growth. In some embodiments, the second bulk tungsten deposition may be performed by simultaneously introducing a tungsten-containing precursor and a reducing agent to deposit another bulk layer by CVD. In some implementations, the deposition process may deposit a small amount of tungsten on the sidewall surfaces, though at slower growth rate than deposition on the tungsten surfaces. For example, growth rate and deposited thickness may be half as much or less on the sidewall surfaces than on the tungsten surfaces. In some implementations, it may be a tenth or even a hundredth as much. In some embodiments, the deposition process may deposit tungsten on all surfaces of the feature at the same growth rate.

In some implementations, operation 215 may proceed without deposition of a nucleation layer. This can allow deposition only on the remaining tungsten in the feature. In many implementations, operation 211 will involve deposition of a nucleation layer to achieve conformal deposition, while operation 215 proceeds with deposition on the etched tungsten layer without an intermediate nucleation layer deposition. In some implementations, a nucleation layer may be deposited on at least the portion of the feature on which further growth is desired. If a nucleation layer is deposited in operation 215 including on sidewall or other surfaces where subsequent deposition is not desired, tungsten nucleation on those surfaces can be selectively inhibited. Methods of inhibiting tungsten nucleation in features are described in U.S. patent application Ser. No. 13/774,350, incorporated by reference herein. Further explanation of a dep-etch-dep scheme is described in U.S. patent application Ser. No. 13/851,885, which is herein incorporated by reference in its entirety.

In some embodiments, the methods involve one or more deposition operations that involve initiating a "rate limited" regime by reducing the reaction rate of conversion from a tungsten precursor to deposited tungsten. This may be implemented by increasing the partial pressure of the tungsten precursor during the second bulk tungsten deposition, such as during operation 215 as described above with respect to FIG. 2.

In a rate limited regime, the deposition rate is limited by the amount of the tungsten-containing precursor, such as tungsten hexafluoride ($WF_6$), supplied to the substrate. In certain examples, the deposition rate on the feature may depend on the partial pressure of the tungsten-containing precursor. This may be achieved by increasing the partial pressure of the tungsten-containing precursor in the processing chamber (e.g., use low flow rates) while maintaining a high reaction rate (e.g., low temperature).

Rate limiting conditions may be characterized, in part, by overall tungsten-containing precursor concentration variations, process temperature, or process pressure. In certain embodiments, the concentration of the tungsten-containing precursor is less inside smaller features than in larger features. Deposition in features of different sizes depends on the feature density of the substrate. For example, in any one given area of the surface of the substrate, if the area has many smaller features, more tungsten is required to deposit on the surfaces of the features in that area because the total surface area of feature sidewalls and bottom surfaces is higher than a same size substrate area having one or two large features. This in turn leads to a pattern loading effect, particularly in the smaller features.

Depositing tungsten in a rate limiting regime allows tungsten to be deposited more evenly across smaller features due to the higher loading effect in the small features than in the large features. Rate limited process conditions may be achieved by supplying predetermined amounts of tungsten-containing precursor into the processing chamber (e.g., use low tungsten-containing precursor flow rates relative to the cavity profile and dimensions), to deposit tungsten either on a selected group of either larger or smaller-sized features.

A predetermined temperature or pressure during deposition may be selected in such a way to not only induce deposition of tungsten on the feature surfaces, but also to control the rate of the reaction. Overall, the substrate temperature may be selected based on chemical compositions, a desired deposition rate, desired concentration distributions of tungsten-containing precursor, and other material and process parameters.

Interrupted Deposition Scheme

An interrupted deposition scheme may be used to deposit tungsten such that the second bulk tungsten deposition process is paused at a predetermined stage. Implementing such a method allows the more challenging small CD features to be filled, while allowing the simpler and larger CD features to fill later. For example, a process may involve:

Dep1 (targeting small CD feature(s))
Selective etch
Short Dep2 (to complete fill the small CD feature(s), leaving large CD feature open)
Treatment (e.g., $B_2H_6$, $SiH_4$ soak)
Continue Dep2

Figure 3:
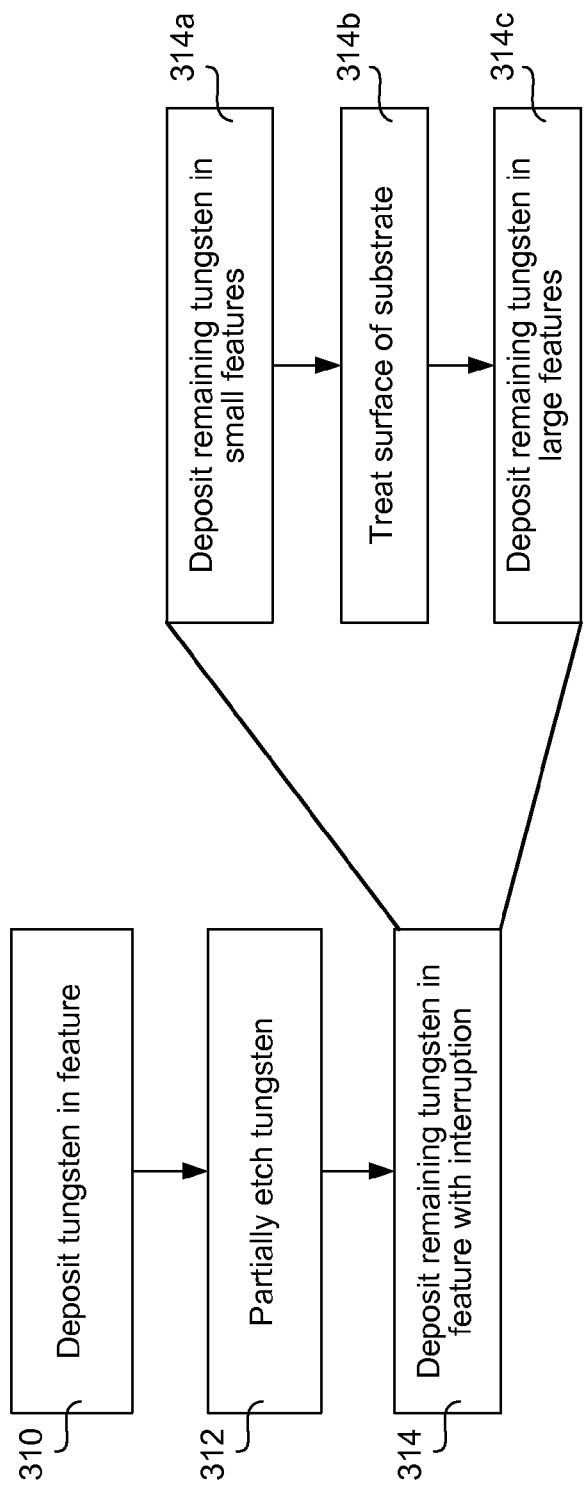
FIGS. 3 and 4 are process flow diagrams for practicing methods in accordance with disclosed embodiments.

FIG. 3 is a process flow diagram depicting a method for depositing tungsten in different sized feature son a substrate in accordance with disclosed embodiments. In operation 310, tungsten is deposited in the features of a substrate having different size features. Tungsten may be deposited using any technique described above with respect to operation 211 in FIG. 2. For example, in various embodiments, a tungsten nucleation layer is deposited followed by the deposition of a first bulk layer of tungsten.

In operation 312, the deposited tungsten is partially etched. Conditions and methods may be any of those described above with respect to operation 213 in FIG. 2. Etching conditions are also discussed further below. Smaller features may be etched such that only the top part of the feature near the surface of the substrate is etched, and that etching stops at the pinch-off location of the feature due to the high aspect ratio and narrow opening. For larger features, however, the etching may enter the feature and also etch the sidewalls in a conformal etch.

In operation 314, the tungsten is deposited into the feature in a second bulk tungsten deposition but the deposition is interrupted at a predetermined time. The predetermined time may be the time in which the small features on the substrate are completely filled with tungsten. At the predetermined time, the second bulk tungsten deposition is temporarily terminated.

As shown, operation 314 may include first depositing the remaining tungsten on the substrate by focusing on completely filling small features in operation 314a, then interrupting the deposition when the small features are filled by treating the surface of the substrate in operation 314b, and depositing the remaining tungsten to fill the large features in operation 314c. Interrupting the tungsten bulk deposition may facilitate subsequent fill in the larger features by one or more mechanisms. In some implementations, the previous etch operation may have an incidental passivation effect that results in a nucleation delay in fill of the large features. For example, exposure to a nitrogen-containing etchant may passivate a portion of the deposition surface. The treatment may remove the passivation and reduce nucleation delay. In some implementations, treating the larger features creates smoother grains in the larger features.

In various embodiments, the operations 314a through 314c are performed in the same chamber and flows are diverted and/or changed between operations 314a and 314b, and between operations 314b and 314c. In some embodiments, operation 314 is interrupted once. In some embodiments, operation 314 is interrupted two, three, or more times, such that operations 314a-314c are repeated until the features are all filled.

The substrate may be treated in operation 314b by various methods. In some embodiments, the substrate is treated by a reducing agent soak, which may be performed by exposing the substrate surface, and therefore the deposited tungsten, to a reducing agent. Examples of reducing agents include boranes (e.g., $B_2H_6$), silanes (e.g., $SiH_4$), and hydrogen ($H_2$). The substrate may be treated with a reducing agent for about 2 seconds to about 10 seconds. The treatment may be a thermal soak and can occur at a temperature ranging from about 200° C. to about 500° C. According to various embodiments, the partial pressure of $H_2$ or other reducing agent can be at least about 15 Torr, at least about 20 Torr, at least about 30 Torr, at least about 40 Torr, at least about 50 Torr, at least about 60 Torr, at least about 70 Torr, or at least about 80 Torr.

In some implementations, a reducing agent soak reduces roughness of the tungsten deposited once the bulk deposition is resumed. In one example, operation 314 may involve exposing the substrate to flows of a tungsten-containing precursor and reducing agent (314a), stopping or diverting the flow of the tungsten-containing precursor for a period of time to allow the reducing agent or treatment chemistry to flow without the tungsten-containing precursor (314b), terminating the treatment chemistry flow, and resuming the tungsten-containing precursor flow to continue the interrupted bulk deposition (314c). In alternate embodiment, operation 314b may involve exposing the substrate to a different reducing agent (e.g., diborane or silane) in addition to or instead of the reducing agent used in the bulk deposition.

The treatment in operation 314b may include exposing the substrate to pulses or continuous nitrogen ($N_2$) gas. Exposing the substrate to pulses of nitrogen helps reduce grain roughness. Some discussion on exposing substrates to pulses of nitrogen is described in U.S. Pat. No. 8,551,885, and U.S. patent application Ser. No. 13/633,798, which are herein incorporated by reference. In some embodiments, the treatment in operation 314b includes annealing the substrate, such as at a temperature between about 200° C. and about 600° C. Annealing the substrate may reduce roughness and provide a smooth surface for tungsten grains to grow on in subsequent processing steps. In some embodiments, the treatment in operation 314b includes depositing a barrier layer on the substrate, such as a fluorine-free WN layer. The barrier layer may be between about 10 Å and 500 Å thick, or, in more specific embodiments, between about 25 Å and 200 Å thick. The barrier layer may be deposited by atomic layer deposition (ALD). The barrier layer may provide a new surface for subsequent tungsten grains to deposit on, thereby forming smaller tungsten grains in the features.

In some embodiments, the treatment in operation 314b includes flowing fluorine-free tungsten precursor into the chamber. Examples of fluorine-free tungsten precursors include tungsten hexachloride ($WCl_6$), MDNOW (methyl-cyclopentadienyl-dicarbonylnitrosyl-tungsten), and EDNOW (ethylcyclopentadienyl-dicarbonylnitrosyl-tungsten). In some embodiments, a combination of these may be performed during the treatment. For example, the treatment may include first depositing fluorine-free tungsten nitride and then annealing the substrate such that the fluorine-free tungsten nitride is converted to fluorine-free tungsten in the feature.

Multiple Dep-Etch-Dep Scheme

Different size features may be filled with tungsten using multiple dep-etch-dep cycles, with each cycle tailored to fill a group of features of similar sizes. An example of a cycle is described above with respect to FIG. 2. Cycles are repeated such that the second deposition of the prior cycle is simultaneously the first deposition of the next cycle. For example, a sequence of "dep-etch-dep-etch-dep-etch-dep" includes a total of three cycles.

A group of features may include one, two, three, four, five, or more different features having the same or similar sizes. For example, a group of features may include three features, each having openings between 1 nm and 2 nm. The total amount of features on a wafer may be split into groups such that one group includes the smallest features, the next groups includes the next smallest features, and so on, until the last group includes the largest features. Each group may be tailored in each dep-etch-dep cycle from the group having the smallest features to the group having the largest features. For example, in the first dep-etch-dep cycle, the group with the smallest features is targeted, and in the next dep-etch-dep cycle, the group with the second smallest features is targeted, etc., until in the last dep-etch-dep cycle, the group with the largest features is targeted.

The term "targeted" may be used to describe the etch chemistries and process conditions used in each corresponding cycle. For example, the first dep-etch-dep cycle targeting the group with the smallest features may include etch processing tailored specifically to etch the smallest features. This may include shorter exposure time to the etchant, lower etchant flow rate, or other modulation in the etch operation. Techniques described in U.S. patent application Ser. No. 13/851,885, which is herein incorporated by reference in its entirety, may be used to fill any particular group of features in accordance with the disclosed embodiments.

During each cycle, the second deposition in any one cycle completely fills the smaller features in target in that cycle, but the second deposition ends before the larger features get pinched off. In the next cycle, the larger features are targeted such that during the second deposition in the corresponding cycle, these larger features are completely filled, but the deposition terminates before the next largest features get pinched off. Smaller CD features are filled during the second deposition, but this operation is terminated before large CD features get pinched off. Another selective etch is then performed targeting fill improvement in the larger CD features followed by a third deposition of bulk tungsten. Since the small CDs are filled already these features are not impacted. For example, a process may involve:

Dep1 (targeting small CD feature(s))
Selective etch
   Short Dep2 (to complete fill of small CD feature(s), leaving large CD feature open)
   Selective etch (non-conformal etch in large CD feature(s), small CD feature(s) stays filled and is not affected)
   Dep3 (fill large CD feature(s))

By performing multiple dep-etch-dep cycles, smaller features are filled first and the largest features are filled last. In this scheme, while etch operations are performed in subsequent processing cycles, the smaller features are not affected because they are already completely filled by their respective dep-etch-dep cycle. Therefore, all features on the substrate, regardless of size, are ultimately filled with void-free, high quality tungsten film.

Figure 4:
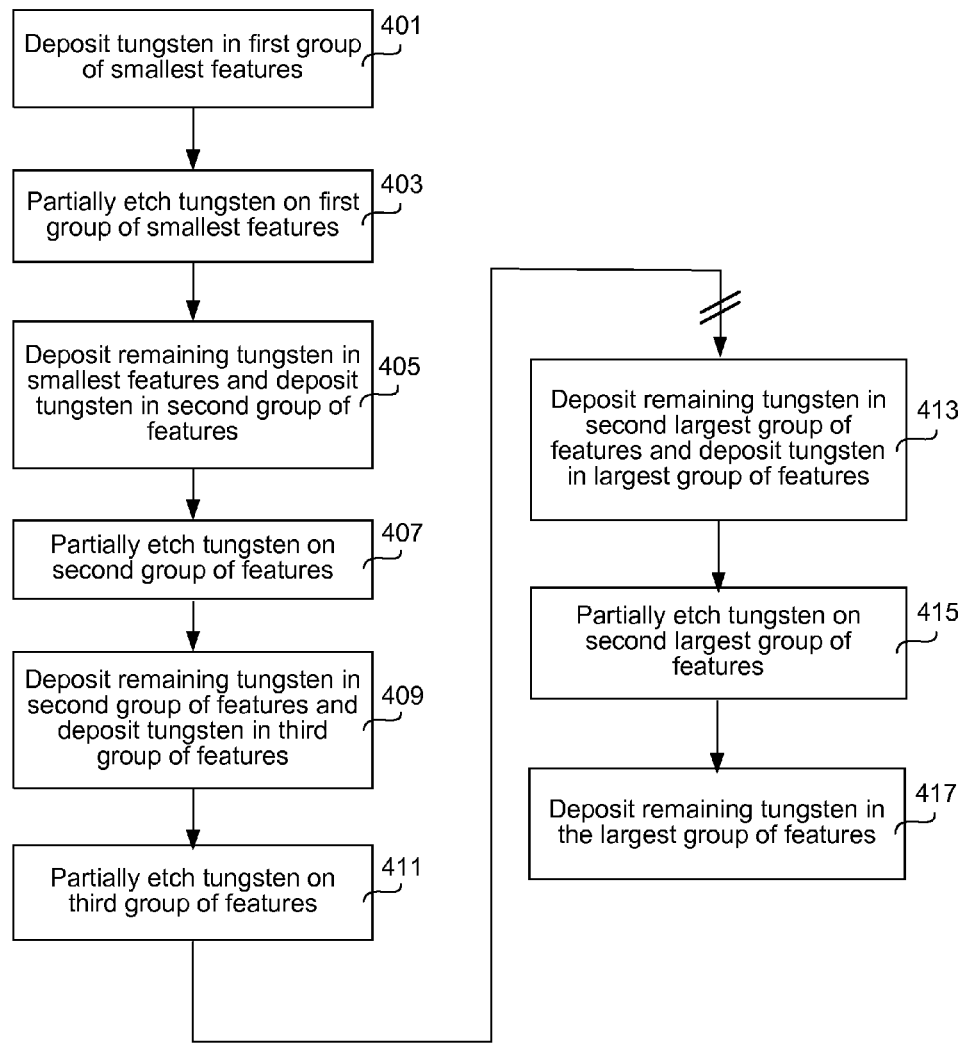

FIG. 4 is a process flow diagram depicting examples of operations for practicing a method of the disclosed embodiments. In operation 401, tungsten is deposited by targeting the first group of smallest features. It should be understood that while the first group of smallest features is targeted, other features may also have tungsten deposited in them. The conditions and method of deposition may be any of those described above in operation 211 with respect to FIG. 2. For example, the substrate may be exposed to $WF_6$ and $H_2$ to deposit tungsten by chemical vapor deposition. In some embodiments, a tungsten nucleation layer is deposited and then a first bulk layer of tungsten is deposited.

In operation 403, the first bulk tungsten deposited in the feature is partially etched. Etch conditions may be tailored to the specific size of the features in the group of the smallest features. For example, if features having an opening between about 1 nm and about 2 nm are being targeted in the first group, the etch conditions may be selected such that tungsten at the tops of these features are etched just enough to open the feature for subsequent deposition. Generally, etching conditions may be any of those describe above with respect to operation 213 in FIG. 2. Etching processes are also further described below.

In operation 405, tungsten is deposited in the features. The deposition conditions and techniques may be any of those described above in operation 213 with respect to FIG. 2. During this operation, tungsten fills the targeted or selected group of features completely, while depositing partially in a second or next targeted group of features having the next smallest size features. The deposition conditions, such as deposition rate, temperature, and pressure of the tungsten-containing precursor, may be rate limited such that the reaction rate depends on depositing tungsten in the smaller features. As discussed above, the rate limited regime helps reduce the pattern loading effect on the substrate where there are many small features, because more tungsten is deposited on the greater surface area of smaller features in a given area of substrate than on the surface area of larger features in the same size area of substrate. Operation 405 may be terminated prior to pinch-off in the next targeted group of features.

In operation 407, the deposited tungsten is partially etched such that the conditions used are tailored to partially etch tungsten in the second targeted group of features. Since each etching is specifically tailored to etch each group of features, etching chemistry and conditions during operation 407 may be different from that of operation 403. In certain implementations, a more (or less, depending on the features) non-conformal etch is used in operation 407 to prevent deep etch in large CD features. For example, operation 407 may be performed such that the temperature is less than the temperature during operation 403. In some embodiments, operation 407 may be performed such that the temperature is greater than the temperature during operation 403.

Aspects of non-conformal etching are described in U.S. Pat. No. 8,435,894, incorporated by reference herein, where a via is partially filled with tungsten, followed by fluorine based etch of tungsten to etch more tungsten near the opening than further in the feature. This may be followed by tungsten deposition to fill the feature. (It should be noted non-conformal etching in U.S. Pat. No. 8,435,894 is referred in places as "selective removal," due to the fact that more material is removed at certain locations of a feature than at other locations. Selective removal as described therein is distinguished from selective etch of one material over another.) Non-conformal etching in the context of the disclosed embodiments refers to preferential or low-step coverage etch. To obtain the preferential (or low step coverage) etch, the etch process conditions are carefully designed. A combination of the right etch temperature, etchant flow and etch pressure can help to achieve the desired conformality. If the etch conformality is not tuned right for each type of re-entrant structure, this could result in poor fill even after the dep-etch-dep sequence.

Step coverage is proportional to (reactant species available for reaction)/(reaction rate). For some implementations of feature etch described herein in which the principle etchant is atomic fluorine, this can be simplified to:

$$W \text{ step coverage} \propto \frac{\text{(atomic } F \text{ concentration)}}{\text{etch rate}}$$

Accordingly, to achieve a certain tungsten etch step coverage (or desired etch conformality or etch non-conformality), the $NF_3$ flow rate (or other F-containing etchant flow rate) and etch temperature are key parameters since they directly affect the concentration of atomic fluorine and etch rate. Other variables like etch pressure and carrier gas flows also carry significance.

At higher temperatures, the incoming fluorine atoms readily react and etch at the feature entrance, resulting in a more non-conformal etch; at lower temperature, the incoming fluorine atoms are able to diffuse and etch further into the feature, resulting in a more conformal etch. Higher etchant flow rate will result in more fluorine atoms generated, causing more fluorine atoms to diffuse and etch further into the feature, resulting in a more conformal etch. Lower etchant flow rate will result in fewer fluorine atoms generated, which will tend to react and etch at the feature entrance, resulting in a more non conformal etch. Higher pressure will cause more recombination of fluorine radicals to form molecular fluorine. Molecular fluorine has a lower sticking coefficient than fluorine radicals and so diffuses more readily into the feature before etching tungsten, leading to a more conformal etch.

Figure 5:
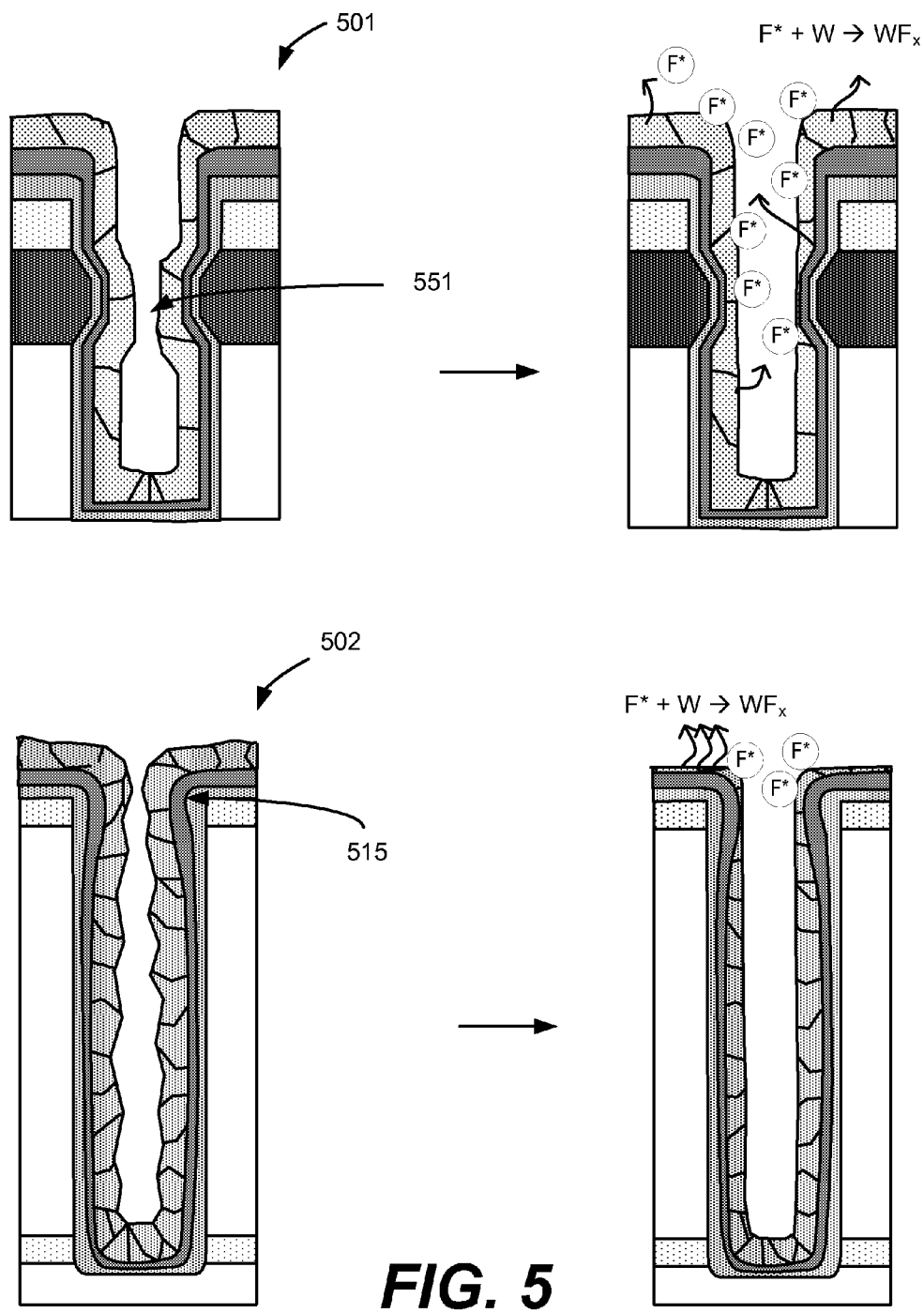
FIG. 5 is a schematic representation of features at various stages of etching that illustrates etch conformality modulation.

FIG. 5 shows cross-sectional schematic illustrations of partial deposition and etch in features 501 and 502 that have different profiles. Feature 501 includes a constriction 551 mid-way down the feature; while feature 502 includes an overhang 515 near the feature opening. Standard CVD-W would result in voids within the feature due to pinch-off by constriction 551 and overhang 515, respectively. The etch of feature 501 is a more conformal etch at lower temperature and/or more etchant species, in this example fluorine radicals (F*), to allow the etchant species to diffuse further into the feature. The etch of feature 502 is a more non-conformal etch at higher temperature and/or less etchant concentration.

Figure 6:
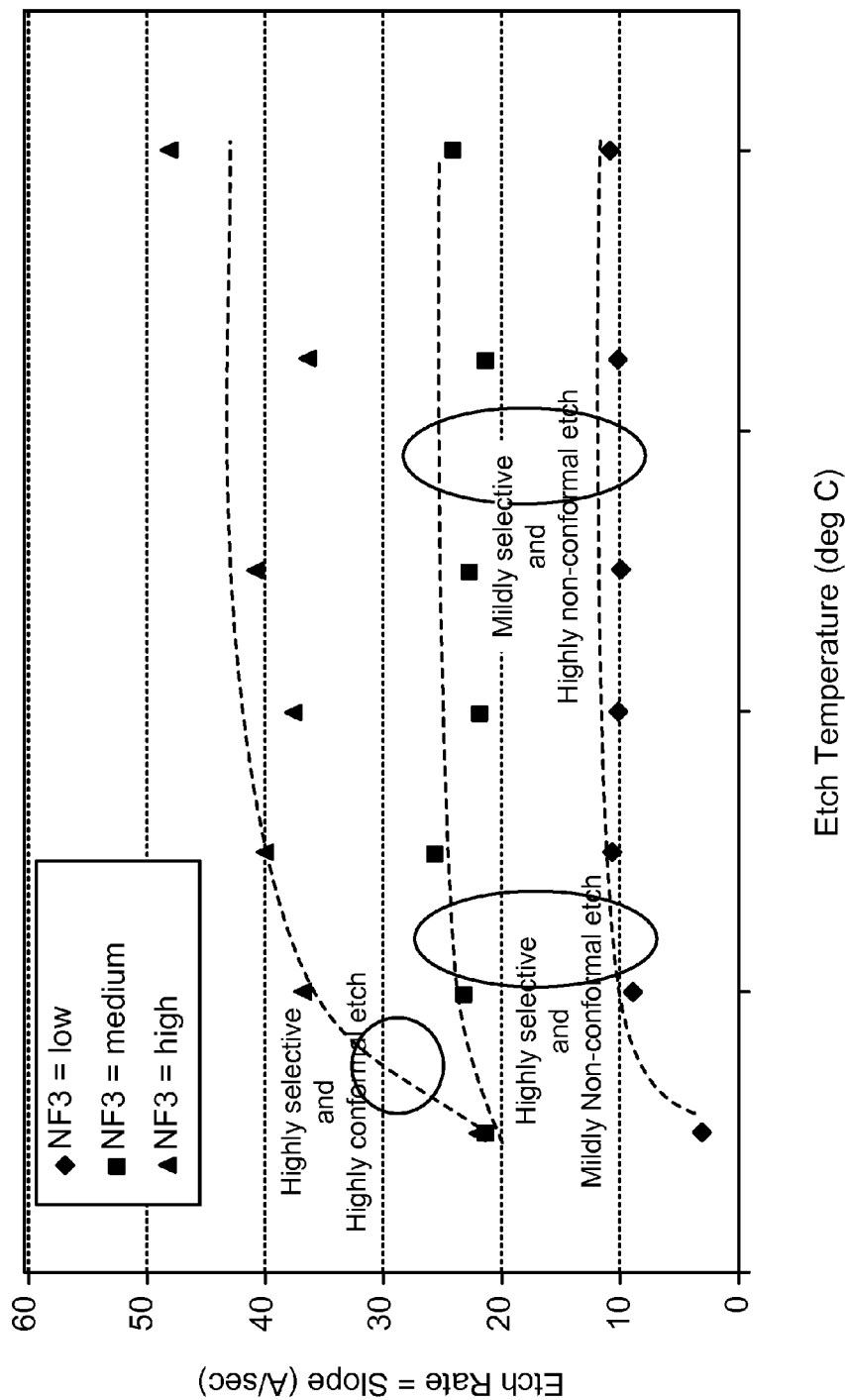
FIG. 6 is a graph showing tungsten etch rate as a function of etch temperature for different etchant flows.

FIG. 6 is a plot of the etch rate as a function of etch temperature for different $NF_3$ flows. Etch conformality can be increased by devising a low etch rate process with high $NF_3$ flow rates. In one example, the region marked "highly selective and high conformal etch" shows process conditions at which the etch is selective (to W over Ti or TiN) and highly conformal throughout the feature. While the lowest etch temperature and highest $NF_3$ flows tested were 25° C. and 100 sccm respectively, even higher conformality can be achieved by reducing the etch temperature and increasing $NF_3$ flow (more atomic F radicals) to achieve a reaction rate limited regime. Conversely, etch non-conformality can be increased by working in a mass transport limited regime wherein high etch rates are achieved with low $NF_3$ flows (fewer atomic F radicals). See, for example, the region marked "mildly selective and highly non-conformal etch."

In some implementations, conformal etching may involve one or more of the following process conditions: temperature below about 25° C., etchant flow above about 50 sccm, and pressure greater than about 0.5 Torr. In some implementations, non-conformal etching may involve one of the following process conditions: temperature above about 25° C., etchant flow below about 50 sccm, and pressure greater less about 2 Torr. A desired level of step coverage (e.g., 60% step coverage) may involve adjusting one or more of these process conditions to make the process more or less conformal.

Returning to FIG. 4, in operation 409, tungsten is deposited on the features such that the second group of features are completely filled and the third group of features having the next larger feature sizes are partially filled. The deposition conditions, such as deposition rate, temperature, and pressure of the tungsten-containing precursor, may be rate limited as described above. Operation 409 is terminated before pinch-off in the next, or third group of features. In operation 411, tungsten is etched using etch chemistry tailored to etch the third group. Note that the etch chemistry would not affect the first or second group of features because those smaller features are already completely filled. It may be possible that the etch chemistry may etch some tungsten on the surface or near the top of the feature, but the etch chemistry is not sufficient to create any voids in the smaller features, and subsequent deposition of tungsten will resume deposition on these surfaces such that there is still void-free smooth tungsten fill. These dep-etch-dep cycles may be repeated such that each group of features is filled in order from the group with the smallest features to the group with the largest features.

As shown in FIG. 4, in operation 413, eventually tungsten is deposited into the second largest group of features to completely fill the features while partially filing tungsten in the largest group of features. In operation 415, the tungsten is etched with conditions tailored to etch the tungsten on the second largest group of features. Lastly, in operation 417, the remaining largest features are filled with tungsten.

Figure 7:
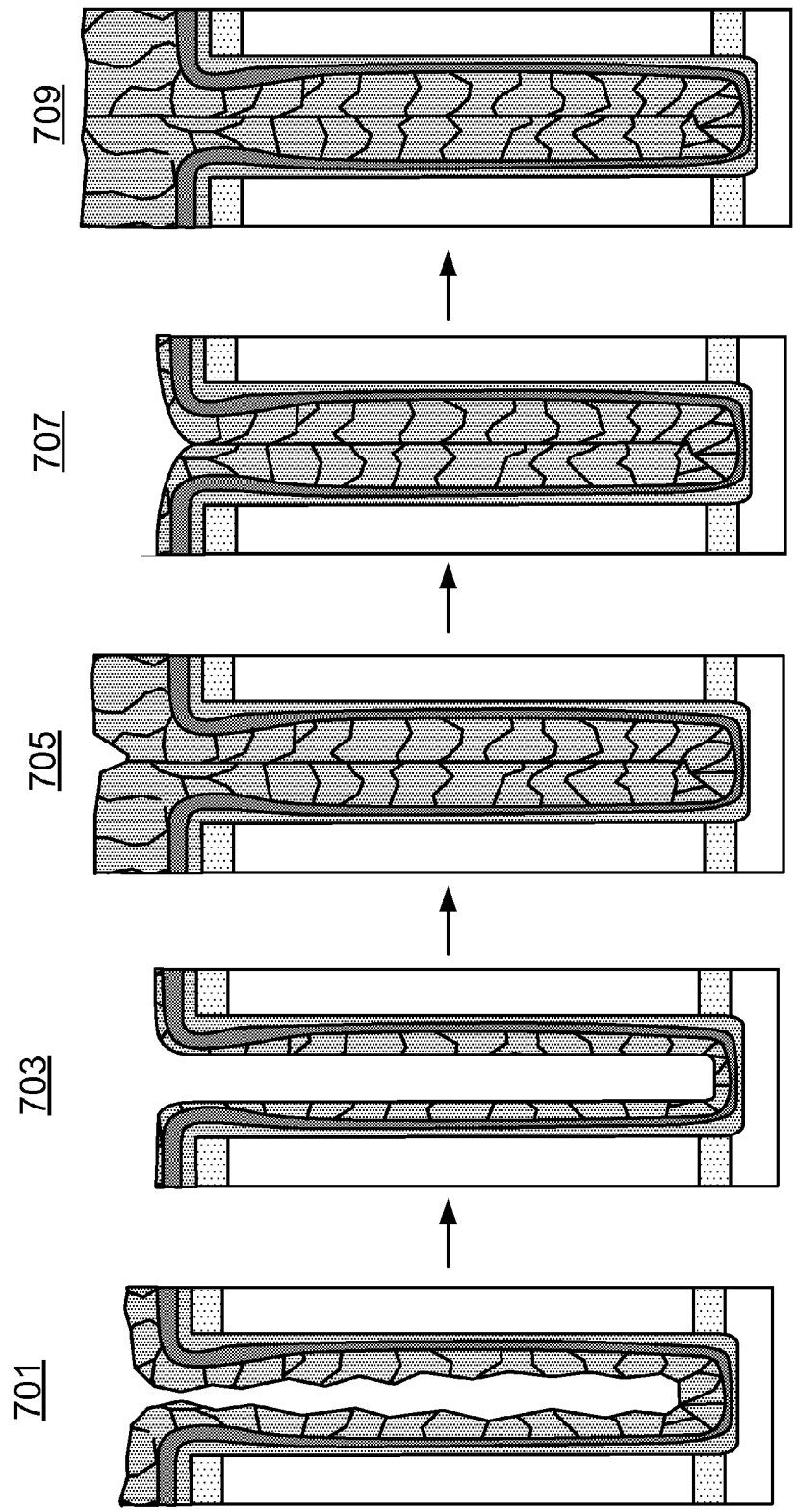
FIG. 7 is a schematic representation of a small feature at various stages of feature fill employing disclosed embodiments.
Figure 8:
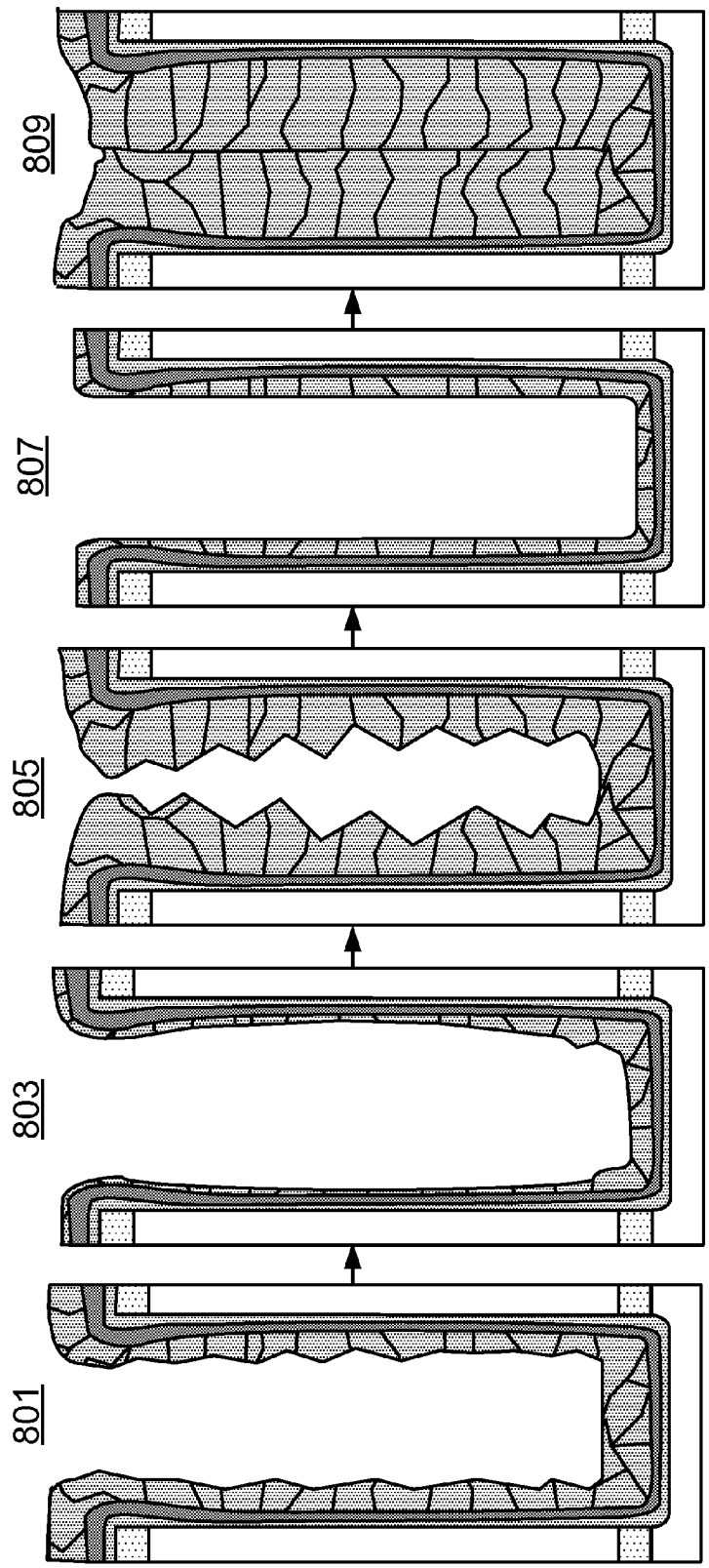
FIG. 8 is a schematic representation of a large feature at various stages of feature fill employing disclosed embodiments.

FIGS. 7 and 8 show examples of a small CD feature (FIG. 7) and large CD feature (FIG. 8) on a single substrate in two cycles of a multiple dep-etch-dep sequence. As shown, 702 in FIGS. 7 and 801 in FIG. 8 map to operation 401 in FIG. 4. Tungsten is deposited in the small CD feature and large feature, which both exhibit conformal growth on the surfaces of the feature. In operation 403 in FIG. 4, the deposited tungsten is etched using etch chemistry tailored to etch the small feature in 703 of FIG. 7 while the deposited tungsten in the large feature in 803 of FIG. 8 is also etched. Note that the etchant species is able to enter into the large feature in 803 and etch the sidewalls of the feature substantially more than the etchant species etches the small feature in 703. In operation 405 in FIG. 4, tungsten is deposited in the features to fill the smallest features as shown in 705. At the same time, tungsten is also deposited into the large features as shown in 805, but note that the deposition is terminated before the larger features are pinched off. In operation 407 in FIG. 4, the larger features are etched with etch chemistry tailored to the larger features, as shown in 807. Although etch chemistry is involved, the etchant does not affected the filled tungsten in the smaller feature in 707, so there is little concern for gaps or voids in the smaller features. In operation 409 in FIG. 4, tungsten is deposited to fill the larger features as shown in 809. At the same time, the smaller features as shown in 709 are not affected—additional tungsten is merely deposited on the surface of the substrate. In the examples shown in FIGS. 7 and 8, only two feature sizes are depicted to show one possible example of multiple dep-etch-dep cycles. It should be understood that a substrate may have features having multiple sizes, such as 20 or more feature sizes, and that etch chemistries may be tailored to features in groups sorted by size, and that groups may include one feature size, or two feature sizes, or more feature sizes, such as five feature sizes in a single group. For example, the largest CD of a large feature in a group having larger features may be 1.5 times, or 2 times, or 5 times, or 10 times, or more than 10 times larger than the largest CD of a small feature in a group having smaller features.

Nucleation Layer Deposition

In some implementations, the methods described herein involve deposition of a tungsten nucleation layer prior to deposition of a bulk layer. A nucleation layer is typically a thin conformal layer that facilitates subsequent deposition of bulk tungsten-containing material thereon. According to various implementations, a nucleation layer may be deposited prior to any fill of the feature and/or at subsequent points during fill of the feature. For example, in some implementations, a nucleation layer may be deposited following etch of tungsten in a feature.

In certain implementations, the nucleation layer is deposited using a pulsed nucleation layer (PNL) technique. In a PNL technique, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. Pat. Nos. 6,635,965; 7,005,372; 7,141,494; 7,589,017; 7,772,114; 7,955,972; 8,058,170; and 8,623,733, all of which are incorporated by reference herein in their entireties. Nucleation layer thickness can depend on the nucleation layer deposition method as well as the desired quality of bulk deposition. In general, nucleation layer thickness is sufficient to support high quality, uniform bulk deposition. Examples may range from about 10 Å-100 Å.

While examples of PNL deposition are provided above, the methods described herein are not limited to a particular method of tungsten nucleation layer deposition, but include deposition of bulk tungsten film on tungsten nucleation layers formed by any method including PNL, ALD, CVD, and physical vapor deposition (PVD). Moreover, in certain implementations, bulk tungsten may be deposited directly in a feature without use of a nucleation layer. For example, in some implementations, the feature surface and/or an already-deposited under-layer supports bulk tungsten deposition. In some implementations, a bulk tungsten deposition process that does not use a nucleation layer may be performed. U.S. patent application Ser. No. 13/560,688, filed Jul. 27, 2012, incorporated by reference herein, describes deposition of a tungsten bulk layer without a nucleation layer, for example.

In various implementations, tungsten nucleation layer deposition can involve exposure to a tungsten-containing precursor such as tungsten hexafluoride ($WF_6$), tungsten hexachloride ($WCl_6$), and tungsten hexacarbonyl ($W(CO)_6$). In certain implementations, the tungsten-containing precursor is a halogen-containing compound, such as $WF_6$. Organo-metallic precursors and precursors that are free of fluorine such as MDNOW (methylcyclopentadienyl-dicarbonylnitrosyl-tungsten) and EDNOW (ethylcyclopentadienyl-dicarbonylnitrosyl-tungsten) may also be used.

Examples of reducing agents can include boron-containing reducing agents including diborane ($B_2H_6$) and other boranes; silicon-containing reducing agents including silane ($SiH_4$) and other silanes; hydrazines; and germanes. In some implementations, pulses of tungsten-containing precursors can be alternated with pulses of one or more reducing agents, e.g., S/W/S/W/B/W, etc., where W represents a tungsten-containing precursor, S represents a silicon-containing precursor, and B represents a boron-containing precursor. In some implementations, a separate reducing agent may not be used, e.g., a tungsten-containing precursor may undergo thermal or plasma-assisted decomposition.

According to various implementations, hydrogen may or may not be run in the background. Further, in some implementations, deposition of a tungsten nucleation layer may be followed by one or more treatment operations prior to tungsten bulk deposition. Treating a deposited tungsten nucleation layer to lower resistivity is described for example in U.S. Pat. Nos. 7,772,114; 8,058,170; and 8,623,733, incorporated by reference herein.

Bulk Deposition

In many implementations, tungsten bulk deposition can occur by a CVD process in which a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Various tungsten-containing gases including, but not limited to, $WF_6$, $WCl_6$, and $W(CO)_6$ can be used as the tungsten-containing precursor. In certain implementations, the tungsten-containing precursor is a halogen-containing compound, such as $WF_6$. In certain implementations, the reducing agent is hydrogen gas, though other reducing agents may be used including silane ($SiH_4$), disilane ($Si_2H_6$) hydrazine ($N_2H_4$), diborane ($B_2H_6$), and germane ($GeH_4$). In many implementations, hydrogen gas is used as the reducing agent in the CVD process. In some other implementations, a tungsten precursor that can decompose to form a bulk tungsten layer can be used. Bulk deposition may also occur using other types of processes including ALD processes.

Examples of temperatures may range from about 200° C. to about 500° C. According to various implementations, any of the CVD W operations described herein can employ a low temperature CVD W fill, e.g., at about 250° C.-350° C. or about 300° C.

Deposition may proceed according to various implementations until a certain feature profile is achieved and/or a certain amount of tungsten is deposited. In some implementations, the deposition time and other relevant parameters may be determined by modeling and/or trial and error. For example, for an initial deposition for an inside out fill process in which tungsten can be conformally deposited in a feature until pinch-off, it may be straightforward to determine based on the feature dimensions the tungsten thickness and corresponding deposition time that will achieve pinch-off. In some implementations, a process chamber may be equipped with various sensors to perform in-situ metrology measurements for end-point detection of a deposition operation. Examples of in-situ metrology include optical microscopy and X-Ray Fluorescence (XRF) for determining thickness of deposited films.

It should be understood that the tungsten films described herein may include some amount of other compounds, dopants, and/or impurities such as nitrogen, carbon, oxygen, boron, phosphorous, sulfur, silicon, germanium, and the like, depending on the particular precursors and processes used. The tungsten content in the film may range from about 20% to about 100% (atomic) tungsten. In many implementations, the films are tungsten-rich, having at least about 50% (atomic) tungsten, or even at least about 60%, 75%, 90%, or 99% (atomic) tungsten. In some implementations, the films may be a mixture of metallic or elemental tungsten (W) and other tungsten-containing compounds such as tungsten carbide (WC), tungsten nitride (WN), etc.

CVD and ALD deposition of these materials can include using any appropriate precursors. For example, CVD and ALD deposition of tungsten nitride can include using halogen-containing and halogen-free tungsten-containing and nitrogen-containing compounds as described further below. CVD and ALD deposition of titanium-containing layers can include using precursors containing titanium with examples including tetrakis(dimethylamino)titanium (TDMAT) and titanium chloride ($TiCl_4$), and if appropriate, one or more co-reactants. CVD and ALD deposition of tantalum-containing layers can include using precursors such as pentakis-dimethylamino tantalum (PDMAT) and $TaF_5$ and, if appropriate, one or more co-reactants. CVD and ALD deposition of cobalt-containing layers can include using precursors such as tris(2,2,6,6-tetramethyl-3,5-heptanedionato)cobalt, bis(cyclopentadienyl)cobalt, and dicobalt hexacarbonyl butylacetylene, and one or more co-reactants. CVD and ALD deposition of nickel-containing layers can include using precursors such as cyclopentadienylallylnickel (CpAllylNi) and $MeCp_2Ni$. Examples of co-reactants can include $N_2$, $NH_3$, $N_2H_4$, $N_2H_6$, $SiH_4$, $Si_3H_6$, $B_2H_6$, $H_2$, and $AlCl_3$.

Tungsten Etch

Etching tungsten can be performed by exposing the tungsten to one or more etchant species that can react with tungsten. Examples of etchant species include halogen species and halogen-containing species. Example of initial etchant materials that can be used for removal of tungsten-containing materials include nitrogen tri-fluoride ($NF_3$), tetra-fluoro-methane ($CF_4$), tetrafluoroethylene ($C_2F_4$), hexafluoroethane ($C_2F_6$), and octafluoropropane ($C_3F_8$), tri-fluoro-methane ($CHF_3$), chlorotrifluoromethane ($CF_3Cl$), sulfur hexafluoride ($SF_6$), and molecular fluorine ($F_2$). In some implementations, the species can be activated and include radicals and/or ions. For example, an initial etchant material may be flown through a remote plasma generator and/or subjected to an in situ plasma. In some implementations, the tungsten may be exposed to non-plasma etchant vapor.

In addition to the examples given above, any known etchant chemistry may be used for etching non-tungsten-containing films as well as tungsten-containing films. For example, fluorine-containing compounds such as $NF_3$, may be used for titanium-containing compounds such as TiN and TiC. Chlorine-containing compounds such as $Cl_2$ and $BCl_3$ may be used in some implementations, for example to etch TiAl, TiAlN, nickel-containing compounds, and cobalt-containing compounds. Further, although etching below refers chiefly to plasma and/or non-plasma vapor phase etching, in some implementations, the methods may also be implemented with wet etching techniques.

In some implementations, a remotely generated plasma may be used. The initial etchant material and, in certain implementations, inert gases, such as argon, helium and others, can be supplied to any suitable remote plasma generator. For example, remote plasma units, such as ASTRON® i Type AX7670, ASTRON® e Type AX7680, ASTRON® ex Type AX7685, ASTRON® hf-s Type AX7645, all available from MKS Instruments of Andover, Mass., may be used. A remote plasma unit is typically a self-contained device generating weakly ionized plasma using the supplied etchant. In some implementations, a high power radio frequency (RF) generator provides energy to the electrons in the plasma. This energy is then transferred to the neutral etchant molecules leading to temperature on the order of 2000K causing thermal dissociation of these molecules. A remote plasma unit may dissociate more than 60% of incoming etchant molecules because of its high RF energy and special channel geometry causing the etchant to adsorb most of this energy.

In some implementations, the activated species from the remote plasma unit delivered to the chamber in which the etch is performed are radicals and include substantially no ionic species. One of ordinary skill in the art will understand that there may be some small number of ionic species that do not contribute to the etch. This amount may be small enough to be undetectable. In some implementations, the activated species from the remote plasma unit delivered to the chamber may include a substantial number of ionic species in addition to radical species.

In some implementations, an etching operation may use a plasma generated in situ in the chamber housing the substrate such that the tungsten in exposed to a direct plasma, in addition to or instead of a remotely generated plasma. In some implementations, a radio frequency (RF) plasma generator may be used to generate a plasma between two electrodes the chamber. Examples of electrodes include a shower head and a pedestal, for example. In one example, a High Frequency (HF) generator capable of providing between about 0 W and 10,000 W at frequencies between about 1 MHz and 100 MHz may be used. In a more specific implementation, the HF generator may deliver between about 0 W to 5,000 W at about 13.56 MHz. In some implementations, a Low Frequency (LF) generator capable of providing between about 0 and 10,000 W at frequencies between about 100 kHz and 2 MHz, or between about 100 kHz and 1 MHz, e.g. 400 kHz may be used.

The plasma generator may be a capacitively coupled plasma (CCP) generator, an inductively coupled plasma (ICP) generator, a transformer coupled plasma (TCP) generator, an electron cyclotron resonance (ECR) generator, or a helicon plasma generator. In addition to RF sources, microwave sources may be used.

According to various implementations, some or all etch operations can be performed in the same chamber in which other operations including deposition and/or treatment operations are performed, or in a dedicated etch chamber. If a dedicated etch chamber is used, it may be connected to the same vacuum environment of one or more other processing chamber, or be part of a separate vacuum environment. For example, TCP etch module such as the Kiyo® conductor etch module, available from Lam Research Corporation in Fremont, Calif., may be used in some implementations. Example etchants that may be used with such a module include $NF_3$, $CF_4$, $SF_6$, $CH_3F$, $CH_2F_2$, and $CF_4$. Example operating pressures can range from about 30 mTorr to about 100 mTorr. Example temperatures can range from about 30° C. to about 120° C.

In various implementations, etching is performed until a certain characteristic of the deposited tungsten is removed or a certain profile is achieved. For example, the etch may proceed until the pinched-off tungsten is removed, or until a seam is removed. In some implementations, the etch endpoint for particular etch process parameters may be determined by modeling and/or trial and error for a particular feature geometry and the profile and amount of deposited tungsten being etched. In some implementations, a process chamber may be equipped with various sensors to perform in-situ metrology measurements to identify the extent of removal. Examples of in-situ metrology include optical microscopy and XRF for determining thickness of films. Further, infrared (IR) spectroscopy may be used to detect amounts of tungsten fluoride ($WF_x$) or other byproducts generated during etching. In some implementations, an under-layer may be used as an etch-stop layer. Optical emission spectroscopy (OES) may also be used to monitor the etch.

Also, according to various implementations, the conformality of an etching operation may be modulated. A conformal etch is an etch in which material is removed uniformly through-out the feature. Methods of modulating etch conformality are described above. In some implementations, modulating etch conformality can include operating or not operating in a mass transport limited regime. In such a regime, the removal rate inside the feature is limited by amounts of and/or relative compositions of different etching material components (e.g., an initial etchant material, activated etchant species, and recombined etchant species) that diffuse into the feature. In certain examples, etching rates depend on various etchant components' concentrations at different locations inside the feature. It should be noted that the terms "etching" and "removal" are used interchangeably in this document.

In some implementations, the recess etch may be performed in one, two, or more etch operations. For example, in a first operation, a fast process to remove tungsten in the field region, followed by a more finely controlled process to etch and control the recess depth. In one example, the faster process could be performed using a higher temperature, higher etchant flow rate and, for a plasma-based etch, a higher plasma power. Example etch rates may be between about 10 Å/sec and about 50 Å/sec for a faster etch. A slower, more controlled process may be done using lower etchant flow and, for a plasma-based etch, lower plasma power. Depending on desired etch selectivity with respect to an under-layer, the temperature may or may not be lower during the controlled etch than during the faster etch. Example etch rates may be between about 3 Å/sec-about 20 Å/sec or about 3 Å/sec-about 10 Å/sec for a controlled etch.

Apparatus

Any suitable chamber may be used to implement this novel method. Examples of deposition apparatuses include various systems, e.g., ALTUS and ALTUS Max, available from Lam Research Corporation of Fremont, Calif., or any of a variety of other commercially available processing systems.

Figure 9:
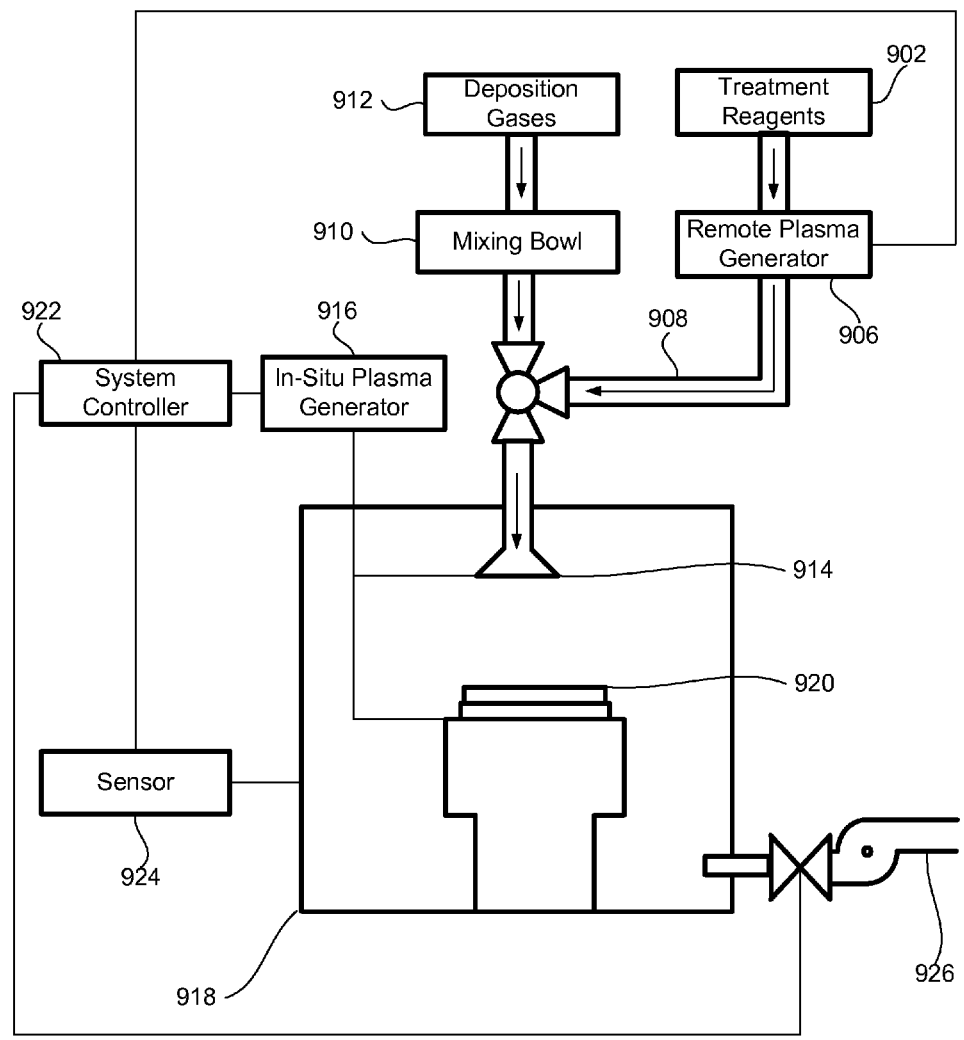
FIG. 9 shows a schematic illustration of a chamber for performing methods in accordance with disclosed embodiments.

FIG. 9 illustrates a schematic representation of an apparatus 900 for processing a semiconductor substrate in accordance with certain embodiments. The apparatus 900 includes a chamber 918 with a pedestal 920, a shower head 914, and an in-situ plasma generator 916. The apparatus 900 also includes a system controller 922 to receive input and/or supply control signals to various devices.

The etchant and, in certain embodiments, inert gases, such as argon, helium and others, are supplied to the remote plasma generator 906 from a source 902, which may be a storage tank. Any suitable remote plasma generator may be used for activating the etchant before introducing it into the chamber 918. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied etchant. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 60% of incoming etchant molecules because of its high RF energy and special channel geometry causing the etchant to adsorb most of this energy.

In certain embodiments, an etchant is flown from the remote plasma generator 906 through a connecting line 908 into the chamber 918, where the mixture is distributed through the shower head 914. In other embodiments, an etchant is flown into the chamber 918 directly completely bypassing the remote plasma generator 906 (e.g., the system 900 does not include such generator). Alternatively, the remote plasma generator 906 may be turned off while flowing the etchant into the chamber 918, for example, because activation of the etchant is not needed.

The shower head 914 or the pedestal 920 typically may have an internal plasma generator 916 attached to it. In one example, the generator 916 is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 916 may generate in-situ plasma to enhance removal of the initial tungsten layer. In certain embodiments, the RF generator 916 is not used during the removal operations of the process.

The chamber 918 may include a sensor 924 for sensing various process parameters, such as degree of deposition and etching, concentrations, pressure, temperature, and others. The sensor 924 may provide information on chamber conditions during the process to the system controller 922. Examples of the sensor 924 include mass flow controllers, pressure sensors, thermocouples, and others. The sensor 924 may also include an infra-red detector or optical detector to monitor presence of gases in the chamber and control measures.

Deposition and selective removal operations generate various volatile species that are evacuated from the chamber 918. Moreover, processing is performed at certain predetermined pressure levels the chamber 918. Both of these functions are achieved using a vacuum outlet 926, which may be a vacuum pump.

Tungsten-containing precursors, as well as treatment chemistry may enter the chamber from showerhead 914 such that a substrate on pedestal 920 is exposed to the precursor or treatment chemistry during various embodiments.

In certain embodiments, a system controller 922 is employed to control process parameters. The system controller 922 typically includes one or more memory devices and one or more processors. The processor may include a CPU or computer, analog, and/or digital input/output connections, stepper motor controller boards, etc. Typically there will be a user interface associated with system controller 922. The user interface may include a display screen, graphical software displays of the apparatus and/or process conditions, and user input devices such as pointing devices, keyboards, touch screens, microphones, etc.

In certain embodiments, the system controller 922 controls the substrate temperature, etchant flow rate, power output of the remote plasma generator 906, pressure inside the chamber 918, treatment reducing agent flow rate, anneal temperature, interruption of the second bulk tungsten deposition to flow treatment chemistry into the chamber, and other process parameters. The controller parameters relate to process conditions such as, for example, timing of each operation, pressure inside the chamber, substrate temperature, etchant flow rates, etc. These parameters are provided to the user in the form of a recipe, and may be entered utilizing the user interface. Signals for monitoring the process may be provided by analog and/or digital input connections of the system controller 922. The signals for controlling the process are output on the analog and digital output connections of the apparatus 900.

The system controller 922 executes system control software including sets of instructions for controlling the timing, mixture of gases, chamber pressure, chamber temperature, and other parameters of a particular process. Other computer programs stored on memory devices associated with the controller may be employed in some embodiments. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the processes in a process sequence can be written in any conventional computer readable programming language: for example, assembly language, C, C++, Pascal, Fortran, or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code. System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

Figure 10A:
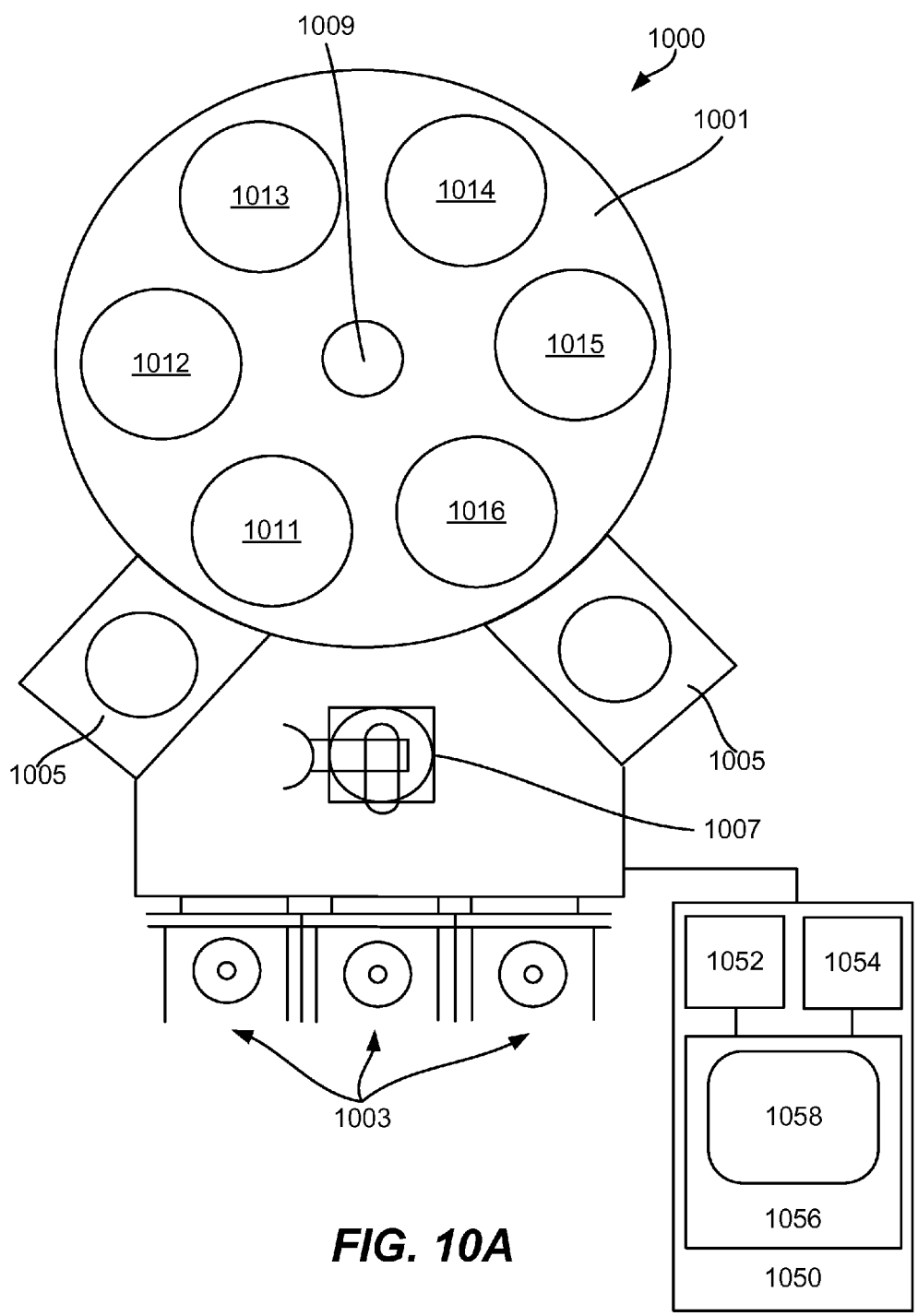
FIGS. 10A and 10B are schematic illustrations of multi-chamber apparatuses for performing methods in accordance with disclosed embodiments.

FIG. 10A shows an example of a multi-station apparatus 1000. The apparatus 1000 includes a process chamber 1001 and one or more cassettes 1003 (e.g., Front Opening Unified Pods) for holding substrates to be processed and substrates that have completed processing. The chamber 1001 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 10A illustrates the process chamber 1001 that includes six stations, labeled 1011 through 1016. All stations in the multi-station apparatus 1000 with a single process chamber 1003 are exposed to the same pressure environment. However, each station may have a designated reactant distribution system and local plasma and heating conditions achieved by a dedicated plasma generator and pedestal, such as the ones illustrated in FIG. 9.

A substrate to be processed is loaded from one of the cassettes 1003 through a load-lock 1005 into the station 1011. An external robot 1007 may be used to transfer the substrate from the cassette 1003 and into the load-lock 1005. In the depicted embodiment, there are two separate load locks 1005. These are typically equipped with substrate transferring devices to move substrates from the load-lock 1005 (once the pressure is equilibrated to a level corresponding to the internal environment of the process chamber 1003) into the station 1011 and from the station 1016 back into the load-lock 1005 for removal from the processing chamber 1003. A mechanism 1009 is used to transfer substrates among the processing stations 1011-1016 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 9. For example, a station 1011 may receive a substrate from a load-lock and be used to pre-heat the substrate before being further processed. Other stations may be used for filling high aspect ratio features including deposition and etching operations.

After the substrate is heated or otherwise processed at the station 1011, the substrate is moved successively to the processing stations 1012, 1013, 1014, 1015, and 1016, which may or may not be arranged sequentially. The multi-station apparatus 1000 is configured such that all stations are exposed to the same pressure environment. In so doing, the substrates are transferred from the station 1011 to other stations in the chamber 1001 without a need for transfer ports, such as load-locks.

In certain embodiments, one or more stations may be used to fill features with tungsten-containing materials. For example, stations 1012 may be used for an initial deposition operation, station 1013 may be used for a corresponding selective removal operation. In the embodiments where a deposition-removal cycle is repeated, stations 1014 may be used for another deposition operations and station 1015 may be used for another partial removal operation. Section 1016 may be used for the final filling operation. It should be understood that any configurations of station designations to specific processes (heating, filling, and removal) may be used. In some embodiments, one station may be used for deposition of tungsten, while other stations are used for etching operations configured for each group of feature sizes to be targeted in a multiple dep-etch-dep scheme. In some embodiments, one station may be used for deposition of the first bulk tungsten layer, another station for the etching operation, and a third station used for second bulk deposition and treatment, such that the wafer is in one station during the second bulk deposition and treatment.

As an alternative to the multi-station apparatus described above, the method may be implemented in a single substrate chamber or a multi-station chamber processing a substrate(s) in a single processing station in batch mode (i.e., non-sequential). In this aspect, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective removal of the deposited layer is then performed. The process may continue with one or more deposition-removal cycles and with the final filling operation all performed on the same station. Alternatively, a single station apparatus may be first used to perform only one of the operation in the new method (e.g., depositing, selective removal, treatment, final filling) on multiple wafers after which the substrates may be returned back to the same station or moved to a different station (e.g., of a different apparatus) to perform one or more of the remaining operations.

FIG. 10A also depicts an embodiment of a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog, and/or digital input/output connections, stepper motor controller boards, etc.

In some embodiments, system controller 1050 controls all of the activities of process tool 1000. System controller 1050 executes system control software 1058 stored in mass storage device 1054, loaded into memory device 1056, and executed on processor 1052. Alternatively, the control logic may be hard coded in the controller 1050. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1058 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, treatment chemistry, etch chemistries for each group of feature sizes, and other parameters of a particular process performed by process tool 1000. System control software 1058 may be configured in any suitable way. For example, various process tool component subroutines or control objects may be written to control operation of the process tool components necessary to carry out various process tool processes. System control software 1058 may be coded in any suitable computer readable programming language.

In some embodiments, system control software 1058 may include input/output control (IOC) sequencing instructions for controlling the various parameters described above.

Other computer software and/or programs stored on mass storage device 1054 and/or memory device 1056 associated with system controller 1050 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1001 and to control the spacing between the substrate and other parts of process tool 1000.

A process gas control program may include code for controlling gas composition (e.g., TMA, ammonia, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1050. The user interface may include a display screen, graphical software displays of the apparatus and/or process conditions, and user input devices such as pointing devices, keyboards, touch screens, microphones, etc.

In some embodiments, parameters adjusted by system controller 1050 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1050 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable media containing instructions for controlling process operations in accordance with the disclosed embodiments may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Figure 10B:
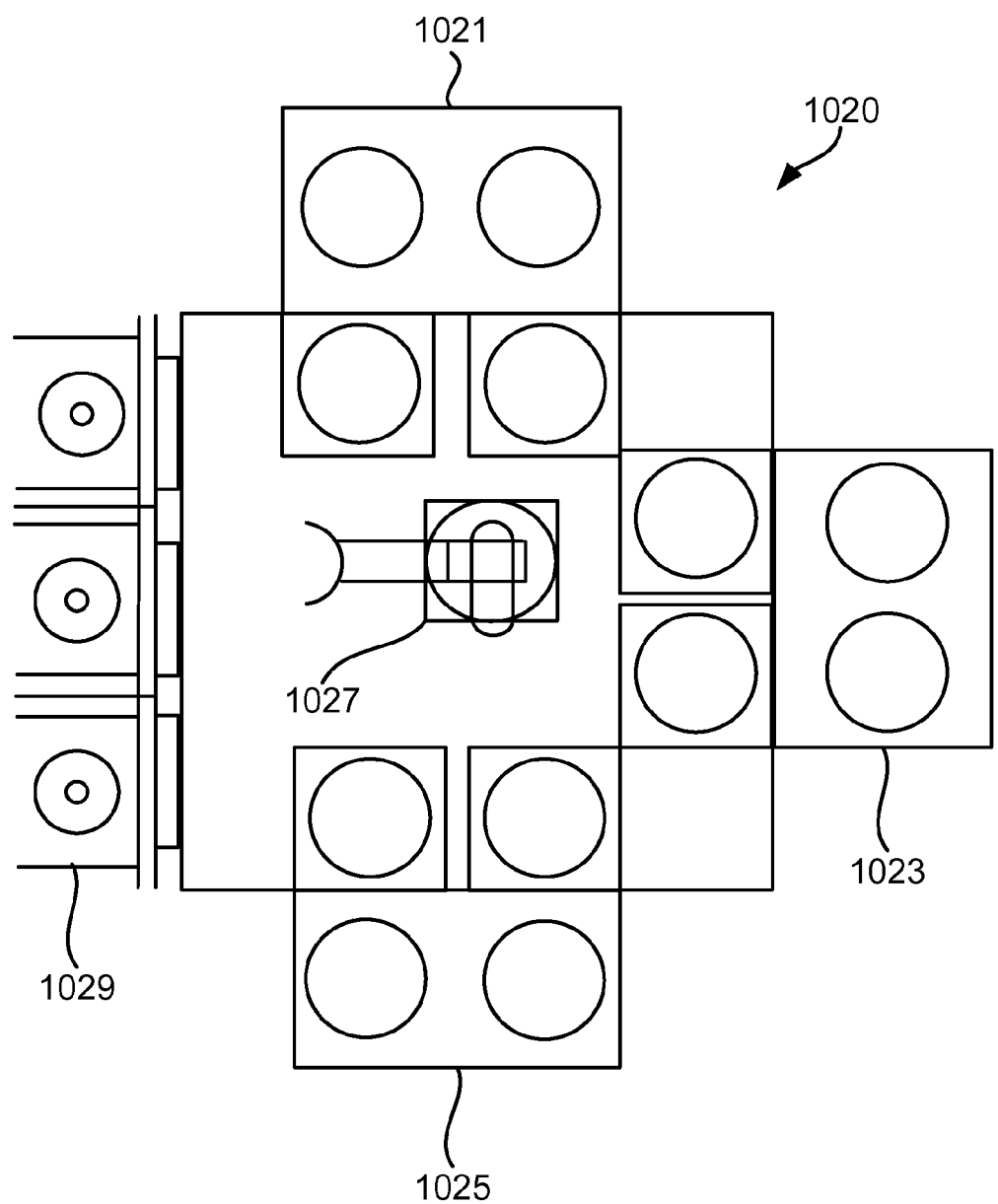

FIG. 10B is a schematic illustration of a multi-chamber apparatus 1020 that may be used in accordance with certain embodiments. As shown, the apparatus 1020 has three separate chambers 1021, 1023, and 1025. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 1021-1025 has its own pressure environment, which is not shared between chambers. Each chamber may have one or more corresponding transfer ports (e.g., load-locks). The apparatus may also have a shared substrate handling robot 1027 for transferring substrates between the transfer ports one or more cassettes 1029.

As noted above, separate chambers may be used for depositing tungsten containing materials and selective removal of these deposited materials in later operations. Separating these two operations into different chambers can help to substantially improve processing speeds by maintaining the same environmental conditions in each chamber. In other words, a chamber does not need to change its environment from conditions used for deposition to conditions used for selective removal and back, which may involve different precursors, different treatment chemistry, different temperatures, pressures, and other process parameters. In certain embodiments, it is faster to transfer partially manufactured semiconductor substrates between two or more different chambers than changing environmental conditions of these chambers.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing semiconductor substrates, comprising:
   (i) providing a substrate comprising features having different size openings including a first feature and a second feature, wherein the first feature is separated and space apart from the second feature, wherein the first feature has a smaller opening than the second feature;
   (ii) depositing a first bulk tungsten layer in the features to partially fill the features;
   (iii) performing a nonconformal etch of the first bulk tungsten layer to leave an etched tungsten layer in the features, including removing more tungsten from the top of the first feature than in the interior of the first feature;
   (iv) depositing a second bulk tungsten layer on the etched tungsten layer; and
   (v) after the first feature is completely filled with tungsten and before the second feature is completely filled with tungsten, treating a surface of the second bulk tungsten layer.

2. The method of claim 1, wherein treating the surface of the second bulk tungsten layer in (v) comprises exposing the substrate to nitrogen.

3. The method of claim 1, wherein the different size openings comprise openings having diameters between about 1 nm and about 1 micron.

4. The method of claim 1, wherein the features comprise features having about twenty different size openings.

5. A method of processing semiconductor substrates, comprising:
   (i) providing a substrate comprising features having at least one group of smaller features and at least one group of larger features, wherein the smaller features are separated and spaced apart from the larger features;
   (ii) depositing a first bulk tungsten layer in the features;
   (iii) etching a portion of the first bulk tungsten layer at a first temperature to leave an etched first bulk tungsten layer;
   (iv) depositing a second bulk tungsten layer on the etched first bulk tungsten layer to fill the at least one group of smaller features and at least partially fill the at least one group of the larger features;
   (v) etching a portion of the second bulk tungsten layer at a second temperature to leave an etched second bulk tungsten layer; and
   (vi) depositing a third bulk tungsten layer on the etched second bulk tungsten layer to fill the at least one group of larger features.

6. The method of claim 5, wherein the first temperature is less than the second temperature.

7. The method of claim 5, wherein the first temperature is greater than the second temperature.

8. The method of claim 5, wherein each of the at least one group of smaller features and the at least one group of larger features comprises features having at least one feature size.

9. The method of claim 5, wherein each of the at least one group of smaller features comprises one feature and each of the at least one group of larger features comprises one feature.

10. The method of claim 5, wherein the at least one group of smaller features comprise features having an opening between about 1 nm and about 2 nm.

11. The method of claim 5, wherein the at least one group of larger features comprise features having an opening between about 100 nm to about 1 micron.

12. The method of claim 5, wherein the largest feature in the at least one group of larger features has a critical dimension at least five times larger than the critical dimension of the largest feature in the at least one group of smaller features.

* * * * *